US008111738B2

(12) United States Patent
Amirichimeh et al.

(10) Patent No.: US 8,111,738 B2
(45) Date of Patent: Feb. 7, 2012

(54) METHOD AND TRANSCEIVER SYSTEM HAVING A TRANSMIT CLOCK SIGNAL PHASE THAT IS PHASE-LOCKED WITH A RECEIVE CLOCK SIGNAL PHASE

(75) Inventors: Abbas Amirichimeh, Irvine, CA (US); Howard Baumer, Laguna Hills, CA (US); John Louie, Huntington Beach, CA (US); Vasudevan Parthasarathy, Irvine, CA (US); Linda Ying, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/881,108

(22) Filed: Sep. 13, 2010

(65) Prior Publication Data
US 2011/0007785 A1      Jan. 13, 2011

Related U.S. Application Data

(63) Continuation of application No. 12/476,207, filed on Jun. 1, 2009, now Pat. No. 7,796,682, which is a continuation of application No. 10/813,363, filed on Mar. 31, 2004, now Pat. No. 7,593,457.

(60) Provisional application No. 60/540,295, filed on Jan. 30, 2004.

(51) Int. Cl.
*H04B 1/38* (2006.01)
*H04L 7/00* (2006.01)
*H04L 23/00* (2006.01)

(52) U.S. Cl. .......................... 375/219; 375/358; 375/376

(58) Field of Classification Search .................. 375/211, 375/219, 220, 222, 295, 316, 354, 356, 358, 375/377, 376; 370/279, 293; 455/7, 14, 455/15, 16; 379/338
See application file for complete search history.

(56) References Cited

U.S. PATENT DOCUMENTS
5,434,719 A      7/1995   Miller et al.
(Continued)

FOREIGN PATENT DOCUMENTS
WO      WO 02/089405 A2     11/2002

OTHER PUBLICATIONS

Search Report from European Patent Appl. No. 05003406.5, 3 pages, dated Mar. 3, 2006.

(Continued)

*Primary Examiner* — Tesfaldet Bocure
(74) *Attorney, Agent, or Firm* — Sterne, Kessler, Goldstein & Fox PLLC

(57) ABSTRACT

A transceiver system is disclosed that includes a plurality of transceiver chips. Each transceiver chip includes one or more SERDES cores. Each SERDES core includes one or more SERDES lanes. Each SERDES lane includes a receive channel and a transmit channel. The transmit channel of each SERDES lane is phase-locked with a corresponding receive channel. The transceiver system has the capability of phase-locking a transmit clock signal phase of a transmitting component with a receive clock signal phase of a receiving component that is a part of a different SERDES lane, a different SERDES core, a different substrate, or even a different board. Each SERDES core receives and transmits data to and from external components connected to the SERDES core, such as hard disk drives. A method of transferring data from a first external component coupled to a receive channel to a second external component coupled to a transmit channel is also disclosed.

20 Claims, 26 Drawing Sheets

U.S. PATENT DOCUMENTS

| | | |
|---|---|---|
| 6,775,328 B1 * | 8/2004 | Segaram ............ 375/257 |
| 6,798,784 B2 | 9/2004 | Dove et al. |
| 6,950,956 B2 | 9/2005 | Zerbe et al. |
| 7,039,118 B1 * | 5/2006 | Segaram ............ 375/257 |
| 7,133,648 B1 | 11/2006 | Robinson et al. |
| 7,155,006 B2 | 12/2006 | Casper et al. |
| 7,251,280 B2 | 7/2007 | Chiang |
| 7,280,612 B2 | 10/2007 | Saed |
| 2003/0053565 A1 | 3/2003 | Yang et al. |
| 2003/0059036 A1 | 3/2003 | Casper et al. |
| 2003/0112031 A1 | 6/2003 | Agrawal et al. |
| 2003/0189903 A1 | 10/2003 | Hsu et al. |
| 2004/0098634 A1 | 5/2004 | Zerbe et al. |
| 2004/0143734 A1 | 7/2004 | Buer et al. |
| 2004/0156325 A1 | 8/2004 | Perkins et al. |
| 2004/0179638 A1 | 9/2004 | Yoshikawa |
| 2005/0034009 A1 | 2/2005 | Sutardja et al. |
| 2005/0163273 A1 | 7/2005 | Scheffel |
| 2005/0169258 A1 | 8/2005 | Millet et al. |
| 2005/0169355 A1 | 8/2005 | Amirichimeh et al. |
| 2005/0169417 A1 | 8/2005 | Amirichimeh et al. |
| 2005/0251595 A1 | 11/2005 | Lesartre |

OTHER PUBLICATIONS

Altera Corporation, "Implementing SFI-4 in Stratix Devices," Stratix Devices Handbook, vol. 2, Chapter 11, pp. 1-12, Apr. 2003, downloaded from http://www.altera.ru/Disks/Altera%20Documentation%20Library/-literature/hb/stx/ch_11_vol_2.pdf.

* cited by examiner (INTRALANE)**

(INTERLANE)

(INTERLANE / INTERCORE)

METHOD AND TRANSCEIVER SYSTEM HAVING A TRANSMIT CLOCK SIGNAL PHASE THAT IS PHASE-LOCKED WITH A RECEIVE CLOCK SIGNAL PHASE

CROSS-REFERENCE TO RELATED APPLICATIONS

This application is a continuation of U.S. patent application Ser. No. 12/476,207, filed Jun. 1, 2009, now U.S. Pat. No. 7,796,682 issued Sep. 14, 2010, which is a continuation of U.S. patent application Ser. No. 10/813,363, filed Mar. 31, 2004, now U.S. Pat. No. 7,593,457, issued Sep. 22, 2009. which claims priority to U.S. Provisional Patent Application No. 60/540,295, filed Jan. 30, 2004, all of which are incorporated herein by reference in their entireties.

BACKGROUND

1. Field of the Invention

This invention relates generally to transceiver devices. More particularly, this invention relates to serializer/deserializer (SERDES) components of a transceiver device, and the phase-locking of a transmit clock signal phase with a receive clock signal phase.

2. Related Art

A serializer/deserializer (SERDES) device converts received high-speed serial data into low-speed parallel data at a receiver. The parallel data may then be processed and then passed to a transmitter. At the transmitter, the low-speed parallel data is converted back into high-speed serial data for transmission out of the SERDES device.

A SERDES device is used to control external devices, or used as a repeater, allowing data from one external device, such as a disk drive, to be transferred to another external device. For example, the external devices may be disk drives that include identical data, providing a back-up mechanism in the event that one disk drive fails. As another example, the external devices may be individual disk drives that, as a group, form one or more databases.

A SERDES device may include a plurality of SERDES cores. Each SERDES core may include one or more receiver/transmitter pairs. Multiple SERDES cores may be daisy-chained together such that data received by one core may be transmitted by another core.

Communication between a receiver and a transmitter of a SERDES device involves high-speed clocks. A typical mode of operation in a SERDES device is a repeat mode in which the transmit data frequency needs to track the receiver data frequency in order to preserve data integrity. This operation must be performed at the receiver without having to retime the recovered clock to the local clock.

For high-speed communication, one typically needs to have very well-matched clocks, especially if transferring data between SERDES cores on different substrates (e.g., chips) or boards. For example, if transferring data from a receiver on one SERDES core to a transmitter on another SERDES core, the clocks between the receiver and the transmitter should be matched in order to sample the data at the right time. If the clocks are not matched, the frequency difference between the two clocks will drift over time, resulting in what appears to be an extra pulse or a missing pulse. This frequency drift will eventually cause a loss of data integrity.

One solution is to use a common clock at the receiver and the transmitter. However, on today's large and complicated systems, it is not practical to run high-frequency lines between every receiver and transmitter. Furthermore, although electronic components are very small, there is a relatively large distance between them. It may not be feasible to maintain a common clock over such a distance. For similar reasons, it may not be feasible to maintain direct clock-matching over such a distance.

SERDES devices that work at much slower speeds and do not link many devices together may not have a frequency drift issue. For example, SERDES devices that work at about 2.5 Gigahertz may not have a frequency drift issue. However, more modern SERDES devices work at 4 Gigahertz or more.

In a transceiver, there is typically a digital portion and an analog portion. When synchronizing a transmitter clock to a receiver clock, and jumping from one frequency to another frequency, instability of the system and loss of data integrity may occur on the analog side. Furthermore, if the frequency change is too large, the new clock pulse width may be larger than the minimum clock pulse width required on the digital side. It is important to prevent large frequency changes such as that just described in order to preserve data integrity and prevent system errors.

What is needed is a high-speed SERDES transceiver device in which a transmitter clock signal is synchronized with a receiver clock signal without the frequency drift problems described above. Furthermore, what is needed is the capability to synchronize a transmitter clock signal with a receiver clock signal of a receiving component that is part of a different SERDES core, a different substrate, or even a different board, without the frequency drift problems such as those described above.

What is also needed is a mechanism to prevent transmitter clock frequency changes that are so large as to violate a minimum pulse width required by a receiver.

SUMMARY

A transceiver system is disclosed that includes a plurality of transceiver chips. Each transceiver chip includes one or more SERDES cores. Each SERDES core includes one or more SERDES lanes. Each SERDES lane includes a receive channel and a transmit channel. The transmit channel of each SERDES lane is phase-locked with a corresponding receive channel.

According to an embodiment of the present invention, each SERDES core receives and transmits data to and from external components connected to the SERDES core. In an embodiment, the external components include disk drives, such as hard disk drives, or removable media drives (e.g., a compact disc drive). The external components may also include databases or other media formats that contain, manipulate, or transfer data.

According to an embodiment of the present invention, the transmit channel and the corresponding receive channel are each part of a common SERDES lane. In another embodiment, the transmit channel is part of a first SERDES lane of a common SERDES core, and the corresponding receive channel is part of a second SERDES lane of the common SERDES core. In a further embodiment, the transmit channel is part of a first SERDES core, and the corresponding receive channel is part of a second SERDES core.

According to an embodiment of the present invention, the first SERDES core and the second SERDES core are disposed on a common substrate. In another embodiment, the first SERDES core is disposed on a first substrate and the second SERDES core is disposed on a second substrate. In one embodiment, the first substrate and the second substrate are disposed on a common board. In another embodiment, the first substrate is disposed on a first board, and the second substrate is disposed on a second board.

A method of transferring data from a first external component coupled to an active receive channel of a transceiver system to a second external component coupled to an active transmit channel of the transceiver system is also disclosed. The transceiver system is that of the various embodiments described above. The external components include, but are not limited to, disk drives. The method includes receiving external component data from the first external component, transferring the external component data and receive clock phase data from the active receive channel to the active transmit channel, phase-locking the transmit clock signal with the receive clock signal per the receive clock phase data, and transmitting the external component data to the second external component.

According to an embodiment of the present invention, the receiving step receives the external component data in analog format, the transferring step transfers the external component data and receive clock signal phase data in digital format, and the transmitting step transmits the external component data in analog format. According to another embodiment of the present invention, the receiving step receives the external component data in series, the transferring step transfers the external component data and receive clock signal phase data in parallel, and the transmitting step transmits the external component data in series.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
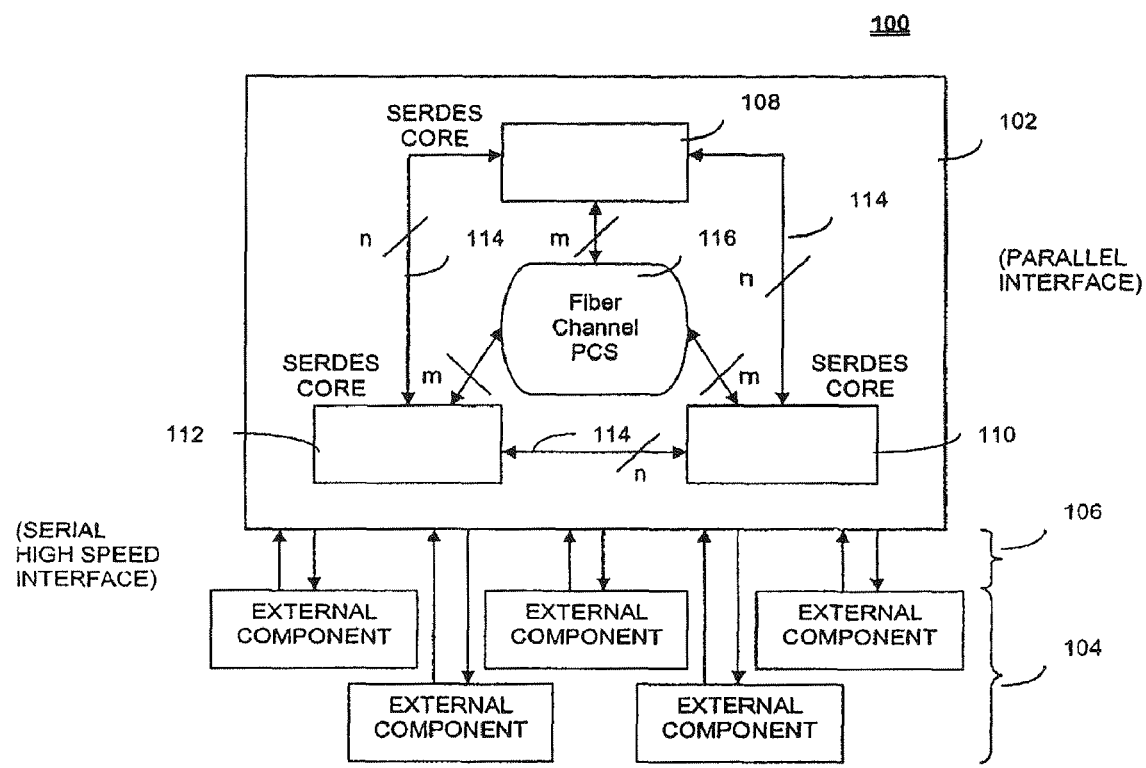
FIG. 1 illustrates an exemplary multiple-core SERDES device connected to a plurality of external components.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE EMBODIMENTS

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

FIG. 1 illustrates an exemplary SERDES system 100, including a single SERDES chip 102 that communicates with a plurality of external components 104 through corresponding transmission and receive lines, serial high speed interface 106. External components 104 may include any combination of external devices such as disk drives or databases. SERDES chip 102 includes three SERDES cores 108, 110, 112. Each SERDES core can communicate with any other SERDES core, as indicated by lines 114. Fiber channel PCS 116 includes internal buses, control logic, and a switching mechanism that need not be discussed herein. SERDES cores 108, 110, 112 and fiber channel PCS 116 are connected through a parallel interface. A SERDES chip, such as SERDES chip 102, may include any number of SERDES cores, and is not to be limited to the three shown in SERDES chip 102. Similarly, the number of external components 104 coupled to SERDES chip 102 can be up to the number that the total number of SERDES cores can handle, as will be discussed in more detail below with reference to FIG. 2.

Figure 2:
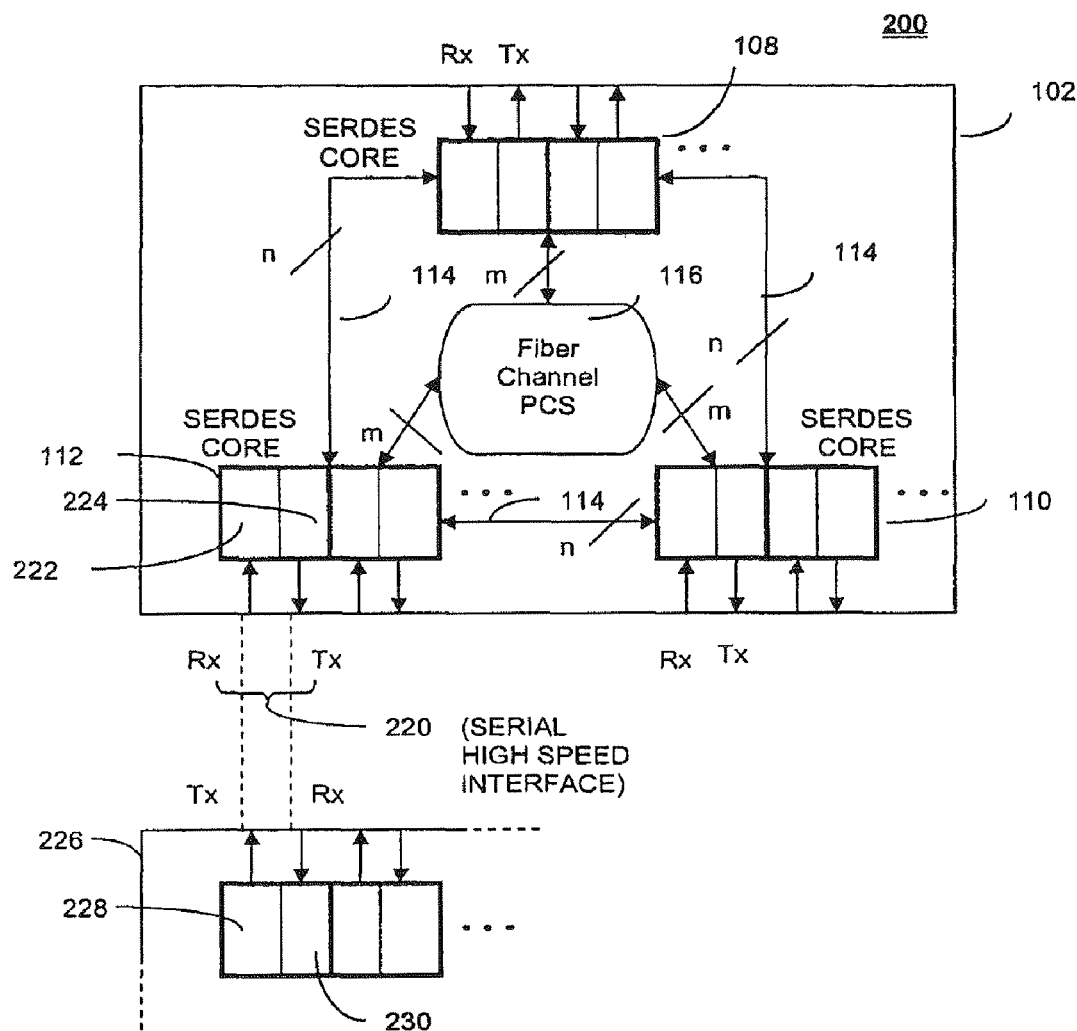
FIG. 2 illustrates a more detailed view of an exemplary multiple-core SERDES device.

FIG. 2 illustrates SERDES chip 102, depicting more detail in the SERDES cores 108, 110, 112. Each SERDES core includes a plurality of communication lanes, and each lane includes a receive channel and a transmit channel. For example, SERDES core 112 includes a plurality of communication lanes, such as lane 220. Lane 220 includes receive channel 222 and transmit channel 224 that are coupled to one of external components 104 of FIG. 1. Receive channel 222 can receive data from the external component 104 of FIG. 1 to which it is coupled. Alternatively, receive channel 222 can receive data from another SERDES core on the same chip or from another chip, such as chip 226. In this way, FIG. 2 depicts a SERDES system 200 that includes daisy-chained SERDES chips 102 and 226. Receive channel 222 of chip 102 receives data from transmit channel 228 of chip 226, and receive channel 230 of chip 226 receives data from transmit channel 224 of chip 102.

Figure 3:
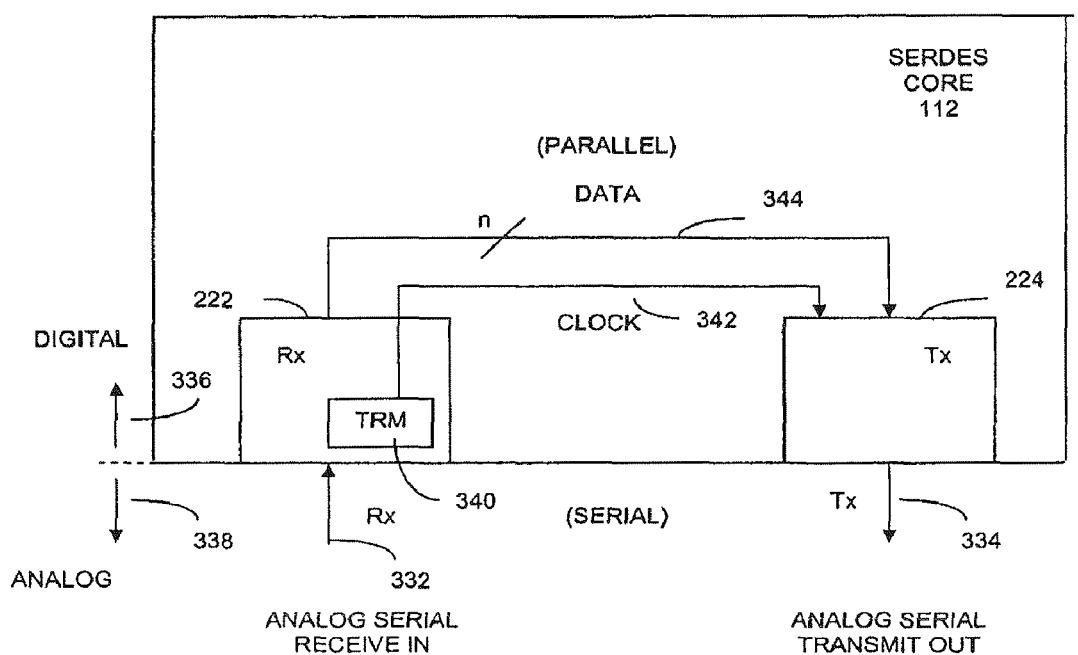
FIG. 3 illustrates an exemplary view of the receiving of analog data by a receiver of a SERDES core, the transferring of the parallel data and clock information to a transmitter of a SERDES core, and the transmission of analog data from the transmitter out of the SERDES core.

FIG. 3 illustrates an exemplary view of a receive channel and a transmit channel of a SERDES core coupled to an external component. The receive channel and transmit channel may be part of a common communication lane, or may be part of different communication lanes. For exemplary purposes, assume FIG. 3 depicts receive channel 222 and transmit channel 224 of SERDES core 112 of FIG. 2. Analog data is transmitted in serial as receive signal 332 to receive channel 222. The analog data of receive signal 332 comes directly from an external component, such as one of external components 104 (of FIG. 1) that is coupled to receive channel 222. The external component 104 transmits data in analog format, as depicted by arrow 338. Once received by SERDES core 112, the data is converted and handled digitally, as depicted by arrow 336.

A timing recovery module 340 prepares receive clock information for transfer to transmit channel 224. Received and digitized data 344 and the receive clock information 342 are transferred in parallel from receive channel 222 to transmit channel 224. The transmit channel synchronizes the transmit clock to the receive clock per receive clock information 342 in order to preserve the integrity of data 344. The digitized data 344 is then converted to analog data and transmitted from transmit channel 224 as a transmit signal 334. Transmit signal 334 is received by the external component 104 (of FIG. 1) that is coupled to transmit channel 224.

Figure 4:
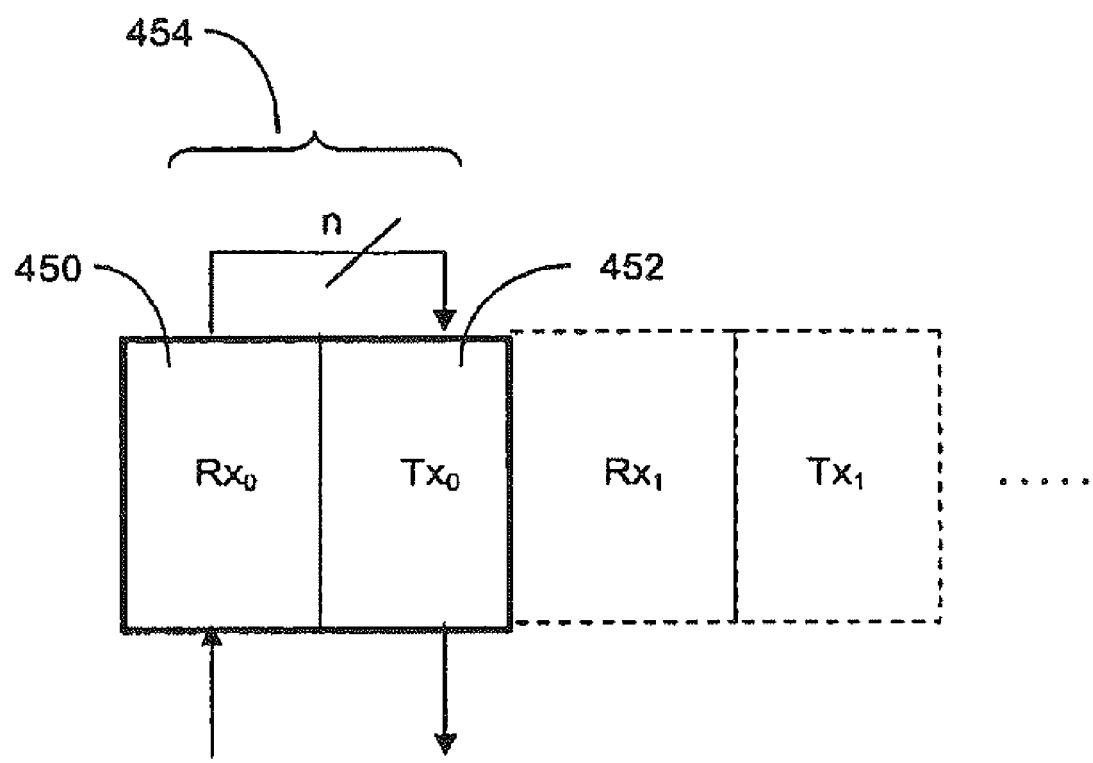
FIG. 4 illustrates an exemplary view of intralane transfer of data between a receiver and transmitter of a common lane of a SERDES core.

An intralane transfer is depicted in FIG. 4. For an intralane transfer, data received at a receive channel may be transferred to and transmitted from a transmit channel of a common communication lane of a SERDES core. In FIG. 4, receive channel 450 transfers data to transmit channel 452 of a common communication lane 454 of a SERDES core.

Figure 5A:
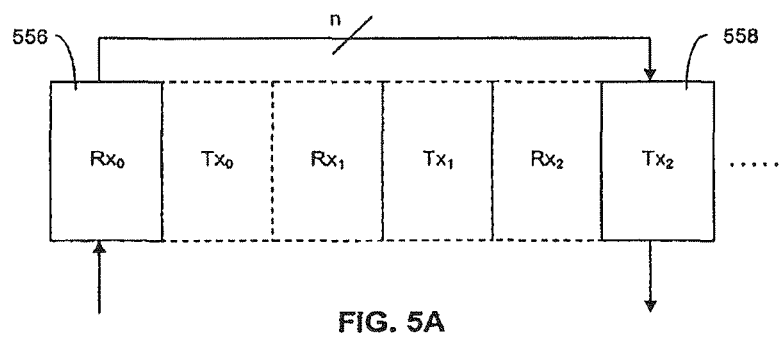
FIG. 5A illustrates an exemplary view of interlane transfer of data between a receiver and a transmitter of different lanes of a SERDES core.
Figure 5B:
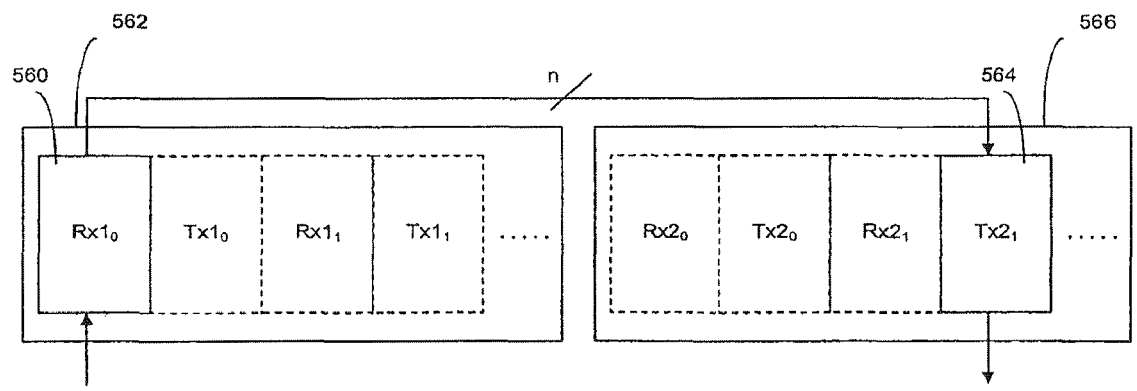
FIG. 5B illustrates an exemplary view of interlane/intercore transfer of data between a receiver and a transmitter of different SERDES cores.

In the alternative, data received at a receive channel may be transferred to and transmitted from a transmit channel of a different communication lane. This is called interlane transfer and is depicted in FIGS. 5A and 5B. In FIG. 5A, receive channel 556 transfers data to transmit channel 558 of a different communication lane of a common SERDES core. In FIG. 5B, receive channel 560 of SERDES core 562 transfers data to transmit channel 564 of SERDES core 566. Because receive channel 560 of SERDES core 562 transfers data to a transmit channel of a different SERDES core, this is called interlane/intercore transfer. In embodiments, the interlane/intercore transfer can even be performed over different substrates.

Figure 6A:
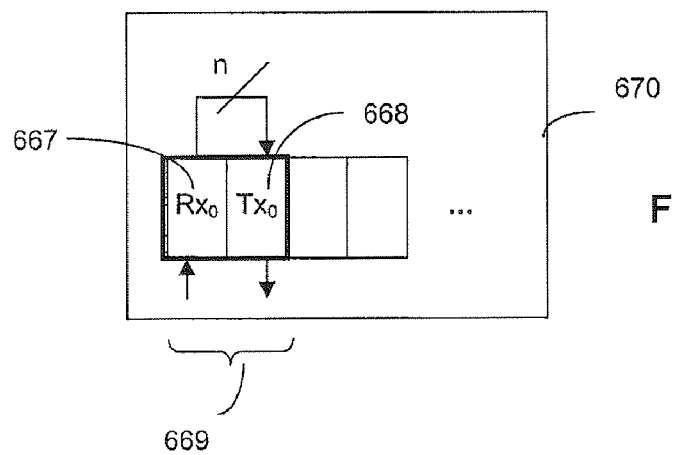
FIG. 6A illustrates an exemplary view of intralane transfer of data between a receiver and transmitter of a common lane of a SERDES core.
Figure 6B:
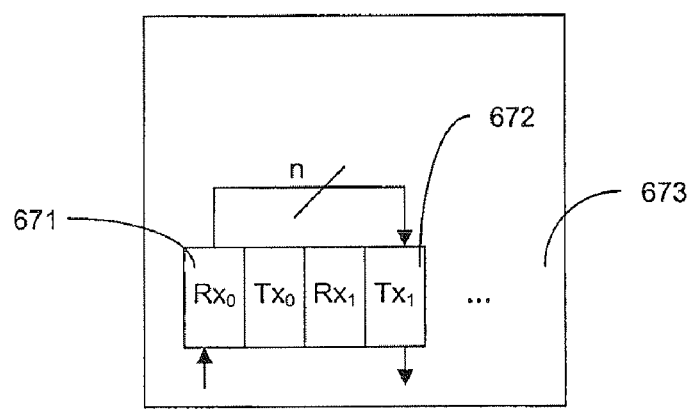
FIG. 6B illustrates an exemplary view of interlane transfer of data between a receiver and a transmitter of different lanes of a SERDES core.
Figure 6C:
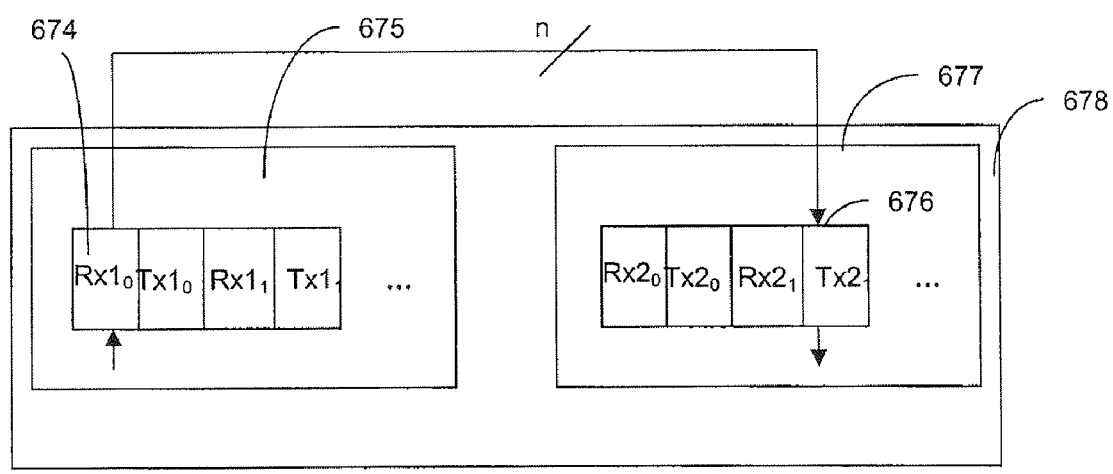
FIG. 6C illustrates an exemplary view of interlane/intercore transfer of data between a receiver and a transmitter of different SERDES cores on a single substrate.
Figure 6D:
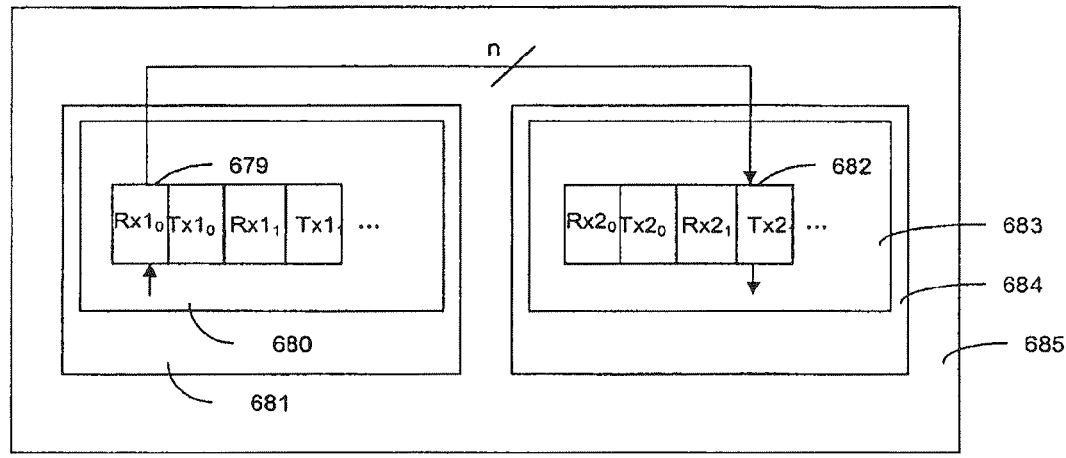
FIG. 6D illustrates an exemplary view of interlane/intercore transfer of data between a receiver and a transmitter of different SERDES cores disposed on different substrates of a single board.
Figure 6E:
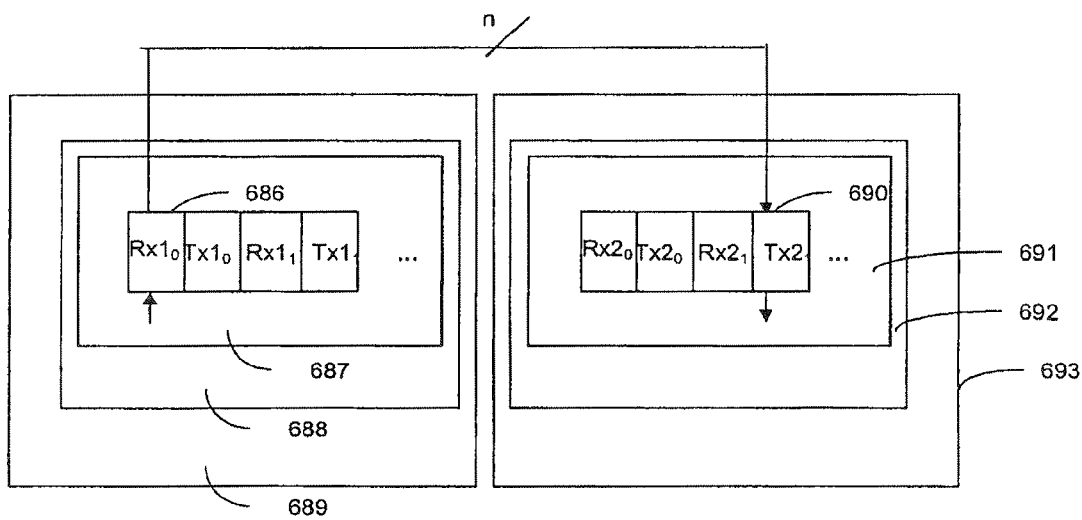
FIG. 6E illustrates an exemplary view of interlane/intercore transfer of data between a receiver and a transmitter of different SERDES cores disposed on different substrates of different boards.

FIGS. 6A-6E illustrate intralane and interlane transfers in slightly more detail. FIG. 6A depicts an example of intralane transfer in which a receive channel 667 transfers data to a transmit channel 668 of a common communication lane 669 of a single SERDES core 670. FIGS. 6B-6E depict examples of interlane transfers. In FIG. 6B, a receive channel 671 transfers data to a transmit channel 672 of a different communication lane of a common SERDES core 673. In FIG. 6C, a receive channel 674 of a SERDES core 675 transfers data to a transmit channel 676 of a SERDES core 677, where SERDES cores 675 and 677 are disposed on a common substrate 678 (an interlane/intercore transfer). In FIG. 6D, a receive channel 679 of a SERDES core 680 transfers data to a transmit channel 682 of a SERDES core 683 (an interlane/intercore transfer), where SERDES cores 680 is disposed on a substrate 681 and SERDES core 683 is disposed on a substrate 684 of a common board 685. In FIG. 6E, a receive channel 686 of a SERDES core 687, disposed on a substrate 688, transfers data to a transmit channel 690 of a SERDES core 691 (an interlane/intercore transfer), disposed on a substrate 692, where substrate 688 is disposed on a board 689 and substrate 692 is disposed on a board 693. FIGS. 6D and 6E are examples of chips and boards, respectively, daisy-chained together for flexibility of communication between more external components, such as external components 104 of FIG. 1.

Figure 7A:
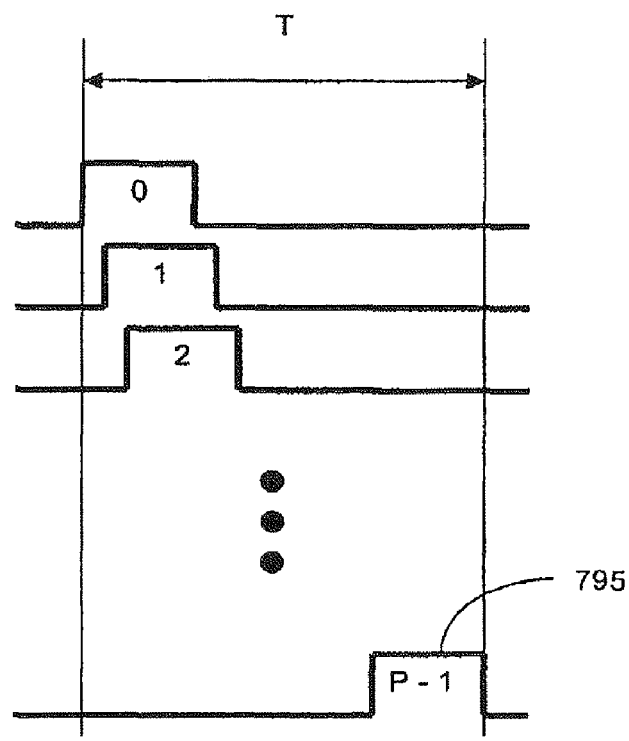
FIG. 7A illustrates the sixty-four (64) possible phases available during a clock cycle for a clock signal, according to an embodiment of the present invention.
Figure 7B:
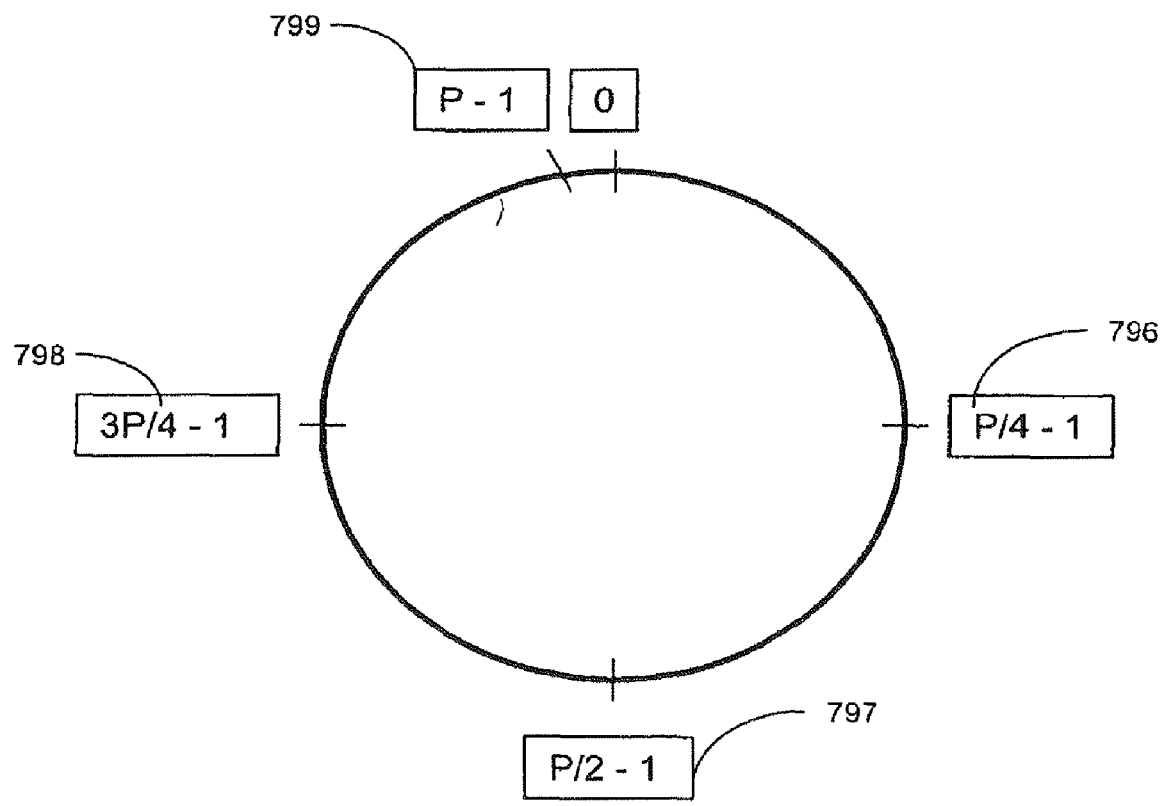
FIG. 7B illustrates, in dial format, the sixty-four (64) possible phases available during a clock cycle for a clock signal, according to an embodiment of the present invention.

The present invention synchronizes a transmit clock signal with a receive clock signal by synchronizing the phases of the transmit clock signal with the receive clock signal. According to the present invention, a single clock cycle is made up of a total of P equally offset phases, phase 0 to phase P−1, as depicted in FIG. 7A. The phases can also be depicted in dial format as shown in FIG. 7B. For example if a clock cycle is defined as having 64 phases (i.e., P=64), then phase 795 of FIG. 7A would be defined as phase 64-1, or phase 63. Similarly, in FIG. 7B, phase 796 would be defined as phase 64/4−1= phase 15, phase 797 would be defined as 64/2−1= phase 31, phase 798 would be defined as 3*64/4−1= phase 47, and phase 799 would be defined as 64−1= phase 63. The purpose of depicting clock signal phases in this manner will become apparent in the description to follow.

Figure 8:
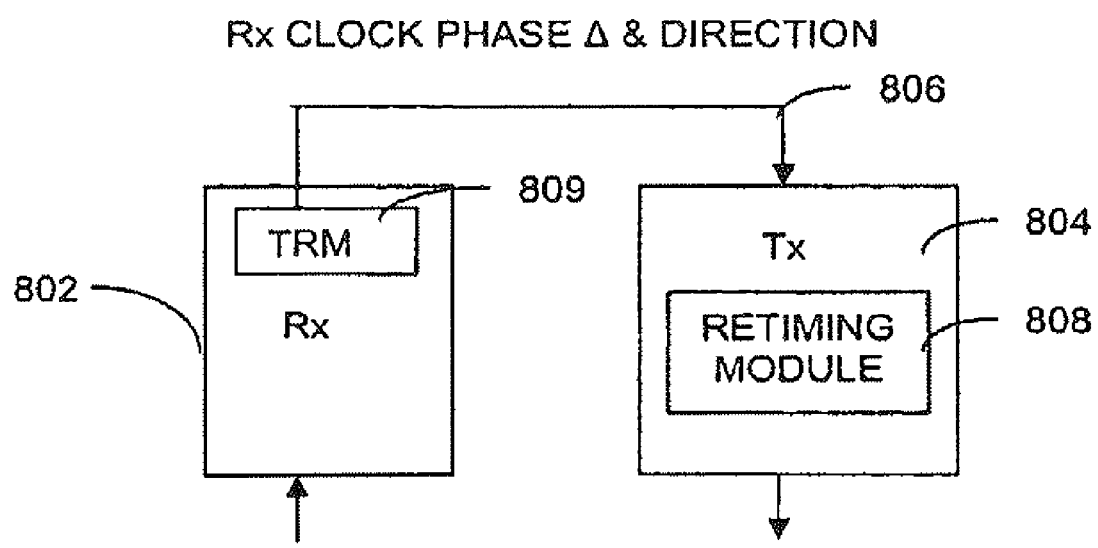
FIG. 8 illustrates an exemplary view of the transfer of a receive clock phase delta and direction from a receiver to a transmitter, according to an embodiment of the present invention.

In the previous description with reference to FIG. 3, it was stated that received and digitized data 344 and receive clock information 342 is transferred in parallel from receive channel 222 to transmit channel 224. According to an embodiment of the present invention, the receive clock information 342 includes a receive clock phase difference between a current receive clock signal phase and a previous receive clock signal phase. The previous receive clock signal phase is delayed in time from the current receive clock signal phase by one cycle of time, for example. In this embodiment, the receive clock information 342 also includes a direction of the receive clock phase difference. FIG. 8 illustrates the transfer 806 of a receive clock phase difference and a direction from receive channel 802 to transmit channel 804. The retiming module 808 of transmit channel 804 adjusts the transmit clock signal phase based on the receive clock phase difference and direction, in order to synchronize the receive and transmit clocks and ensure the integrity of the data transferred out from transmit channel 804.

The receive clock phase difference and direction are determined at the timing recovery module 809 of receive channel 802. The receive clock phase difference is the difference between a current receive clock signal phase and a previous receive clock signal phase. The direction is an indication of whether the transmit clock signal phase is to be adjusted forward or backward by the receive clock phase difference. For example, if the receive clock phase difference is determined to be 16, and the direction is determined to be backward, then in a 64-phase system in which a current transmit clock signal phase is 15, then an adjusted transmit clock signal phase would start at phase 15 (located at phase 796 of FIG. 7B) and move backward (i.e., counter-clockwise) on the dial of FIG. 7B by 16 phases, resulting in an adjusted transmit clock signal phase of 63 (located at phase 799 of FIG. 7B).

Figure 9:
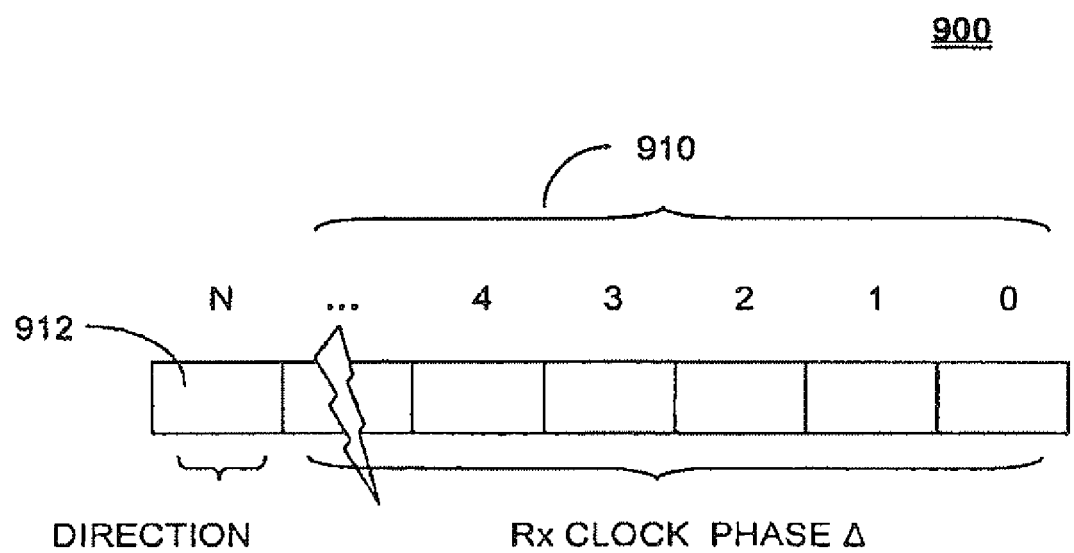
FIG. 9 illustrates an exemplary bit allocation for transferring a receive clock phase difference (delta) and direction.

In an embodiment of the present invention, the transfer of the receive clock phase difference and direction is accomplished with an N-bit sequence 900 as depicted in FIG. 9. The first N−1 bits 910 of bit sequence 900 indicate the phase difference, and the $N^{th}$ bit 912 indicates the direction. Using the information provided in the previous example, if in a 64-phase system the receive clock phase difference is determined to be 16, then bits 910 would include six bits in the following sequence: 010000. In one embodiment, a one ('1') in bit 912 indicates a direction of forward, and a zero ('0') in bit 912 indicates a direction of backward. In another embodiment, a zero ('0') in bit 912 indicates a direction of forward, and a one ('1') in bit 912 indicates a direction of backward.

Figure 10:
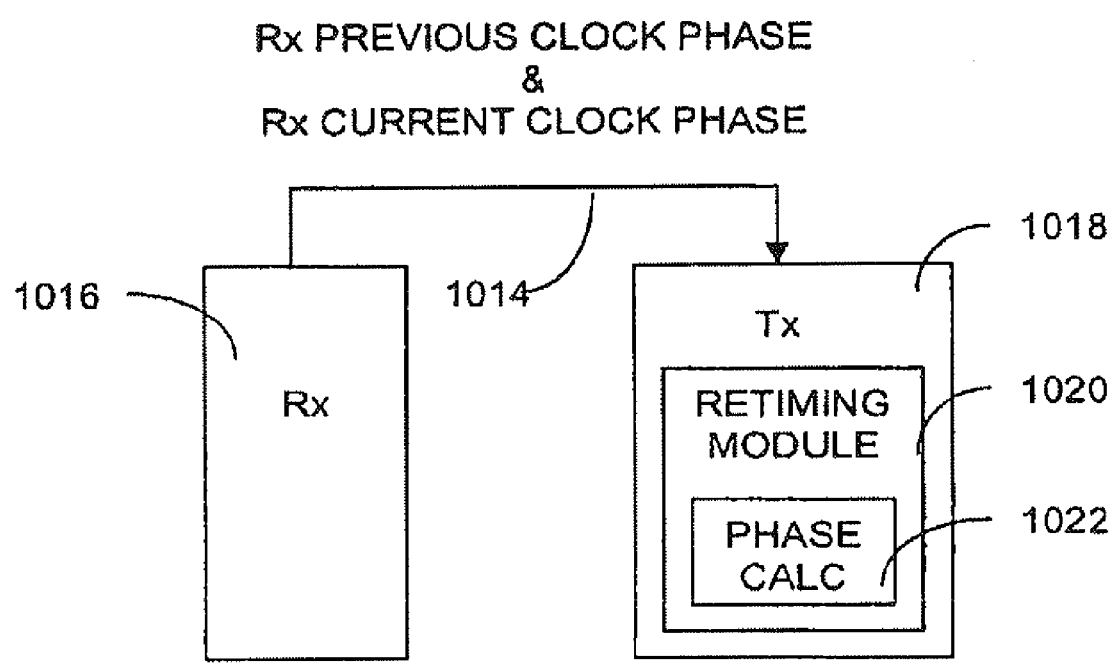
FIG. 10 illustrates an exemplary view of the transfer of a previous receive clock phase and a current receive clock phase from a receiver to a transmitter, according to an embodiment of the present invention.

According to an alternative embodiment of the present invention, the receive clock information 342 includes a previous receive clock signal phase and a current receive clock signal phase. FIG. 10 illustrates the transfer 1014 of a previous receive clock signal phase and a current receive clock signal phase from receive channel 1016 to transmit channel 1018. The retiming module 1020 of transmit channel 1018 adjusts the transmit clock signal phase based on previous receive clock signal phase and a current receive clock signal phase, in order to synchronize the receive and transmit clocks and ensure the integrity of the data transferred out from transmit channel 1018. To do this, retiming module 1020 includes a phase calculator 1022.

Figure 11:
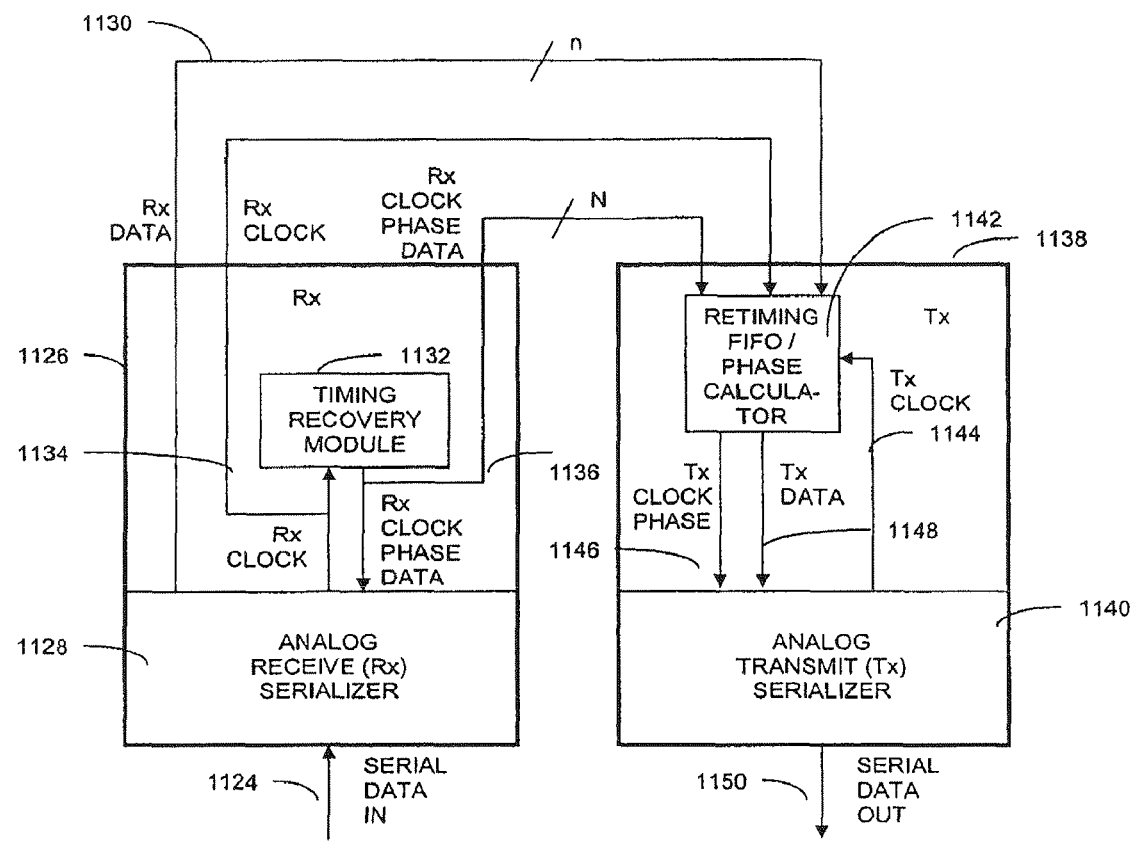
FIG. 11 illustrates a more detailed view of the transfer of a receive clock phase data from a receiver to a transmitter, according to an embodiment of the present invention.

FIG. 11 depicts a more detailed view of the system depicted in FIGS. 8 and 10. Serial data 1124 is received by a receive channel 1126 from either an external component, such as one of external components 104, or from a transmit channel. Receive channel 1126 includes an analog receive serializer 1128 and a timing recovery module 1132. The serial data 1124 is put into digital format by analog receive serializer 1128, creating digitized data 1130. Timing recovery module 1132 receives a receive clock signal 1134 and determines a phase difference between the phase of the current receive clock signal 1134 and a stored previous receive clock signal phase. The timing recovery module also determines a direction of the phase difference between the phase of the current receive clock signal 1134 and the stored previous receive clock signal phase, as described earlier with reference to FIG. 8. The timing recovery module then outputs the phase difference and direction as receive clock phase data 1136. In an embodiment of the present invention, the receive clock phase data 1136 is output in the N-bit sequence format as described earlier with reference to FIG. 9. Other formats are also possible, as would be appreciated by those skilled in the art. On a receive clock signal pulse, the digitized data 1130, the current receive clock signal 1134 and the receive clock phase data 1136 are transferred in parallel to transmit channel 1138.

Transmit channel 1138 includes an analog transmit serializer 1140 and a retiming first-in-first-out register (FIFO)/phase calculator 1142. Retiming FIFO/phase calculator 1142 has the role of retiming module 808 as previously described in reference to FIG. 8. On a receive clock pulse, returning FIFO/phase calculator 1142 receives and writes digitized data 1130, current receive clock signal 1134 and receive clock phase data 1136 from receive channel 1126. Retiming FIFO/phase calculator 1142 also receives a transmit clock signal 1144. On a transmit clock signal pulse, retiming FIFO/phase calculator 1142 determines a new transmit clock phase 1146 based on the receive clock phase data 1136, and outputs the new transmit clock phase 1146 and the digitized data 1148. The analog transmit serializer 1140 receives the new transmit clock phase 1146 and the digitized data 1148. The analog transmit serializer 1140 places the digitized data 1148 into analog format and adjusts the transmit clock signal based on the new transmit clock phase 1146. On an adjusted transmit clock signal pulse, serial data 1150 is output from transmit channel 1138.

Figure 12:
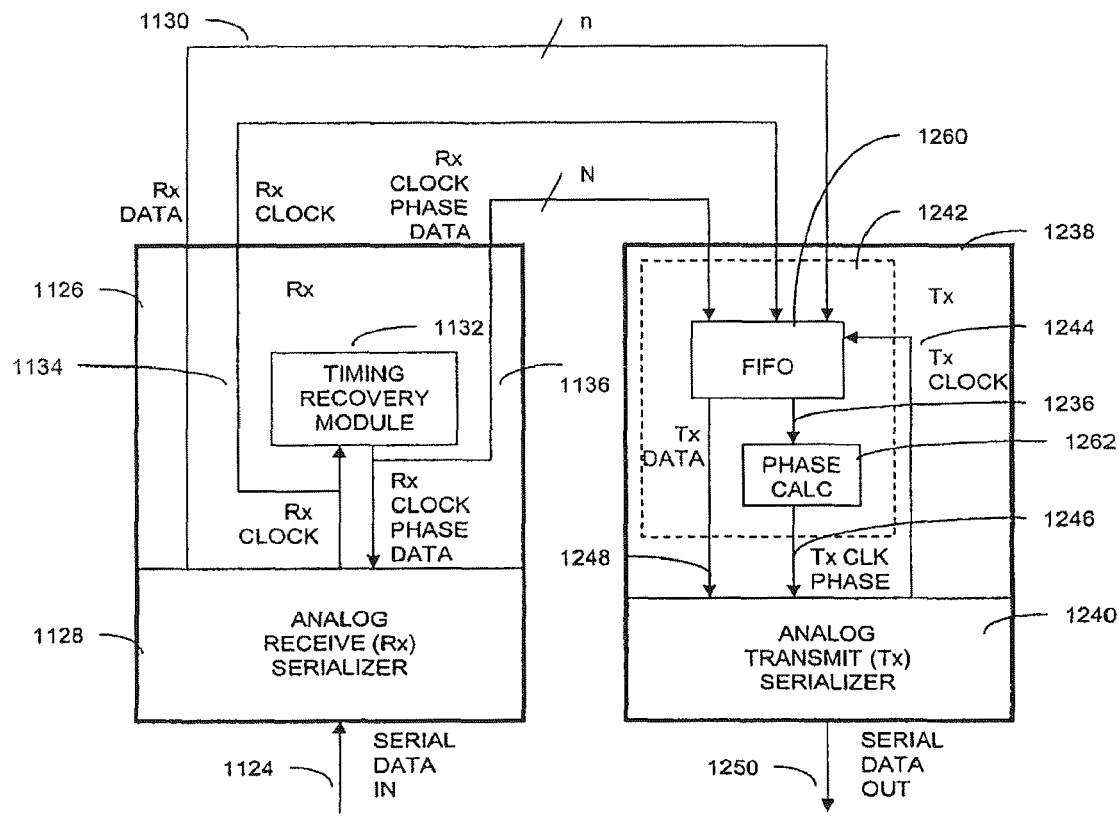
FIG. 12 illustrates another more detailed view of the transfer of a receive clock phase data from a receiver to a transmitter, according to another embodiment of the present invention.

FIG. 12 depicts a slightly more detailed view of the system depicted in FIG. 11. The description of the components and role receive channel 1126 in FIG. 12 is similar to that of the description provided above with reference to FIG. 11. Similar to the description of FIG. 11, on a receive clock signal pulse, the digitized data 1130, the current receive clock signal 1134 and the receive clock phase data 1136 are transferred in parallel to transmit channel 1238.

Transmit channel 1238 includes an analog transmit serializer 1240 and a retiming module 1242. Retiming module 1242 has the role of retiming module 808 and 1020 as previously described in reference to FIGS. 8 and 10. Retiming module 1242 includes a first-in-first-out register 1260 and a phase calculator 1262. On a receive clock pulse, retiming module 1242 receives and writes digitized data 1130, current receive clock signal 1134 and receive clock phase data 1136 from receive channel 1126 to FIFO register 1260. FIFO register 1260 also receives a transmit clock signal 1244. On a transmit clock signal pulse, FIFO register 1260 outputs digitized data 1248 and phase calculation data 1236, which includes current receive clock signal 1134, receive clock phase data 1136, and transmit clock signal 1244. Phase calculator 1262 receives the phase calculation data 1236 and determines and outputs a new transmit clock phase 1246 based on the phase calculation data 1236. The analog transmit serializer 1240 receives the new transmit clock phase 1246 and the digitized data 1248. The analog transmit serializer 1240 places the digitized data 1248 into analog format and adjusts the transmit clock signal based on the new transmit clock phase 1246. On an adjusted transmit clock signal pulse, serial data 1250 is output from transmit channel 1238.

Figure 13A:
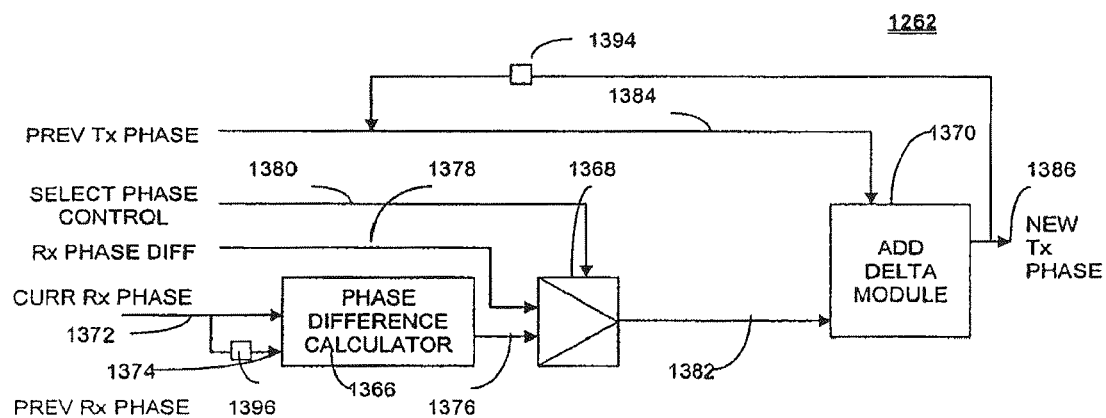
FIG. 13A illustrates a detailed view of the phase calculator depicted in FIG. 12, according to an embodiment of the present invention.

FIG. 13A is a more detailed view of phase calculator 1262, according to an embodiment of the present invention. Phase calculator 1262 includes a phase difference calculator 1366, a phase control multiplexer 1368, and an add delta module 1370. Phase difference calculator 1366 receives a current receive clock signal phase 1372 from FIFO register 1260 and a previous receive clock signal phase 1374. Previous receive clock signal phase 1374 is provided by a delay element register 1396, based on a previously stored current receive clock signal phase 1372. Phase difference calculator 1366 determines a calculated phase difference 1376. In an embodiment, the calculated phase difference 1376 includes both a phase difference and a direction, as described above. Phase control multiplexer 1368 receives the calculated phase difference 1376, a predetermined phase difference (including direction) 1378, and a select phase control signal 1380. In an embodiment of the present invention, the predetermined phase difference 1378 is determined at receiving channel 1126, provided to transmit channel 1238 as receive clock phase data 1136, and provided to phase difference calculator 1366 as part of phase calculation data 1236. Phase control multiplexer 1368 selects either calculated phase difference 1376 or predetermined phase difference 1378 depending on the select phase control signal 1380. Phase control multiplexer then outputs either the calculated phase difference 1376 or predetermined phase difference 1378 as phase adjustment value 1382. In an embodiment, add delta module 1370 receives phase adjustment value 1382 and a previous transmit clock signal phase 1384. The add delta module 1370 determines a new transmit phase value 1386 based on phase adjustment value 1382 and previous transmit clock signal phase 1384. New transmit phase value 1386 is fed back to delay element register 1394 for the next cycle, in which previous transmit clock signal phase 1384 is provided by delay element register 1394.

Figure 13B:
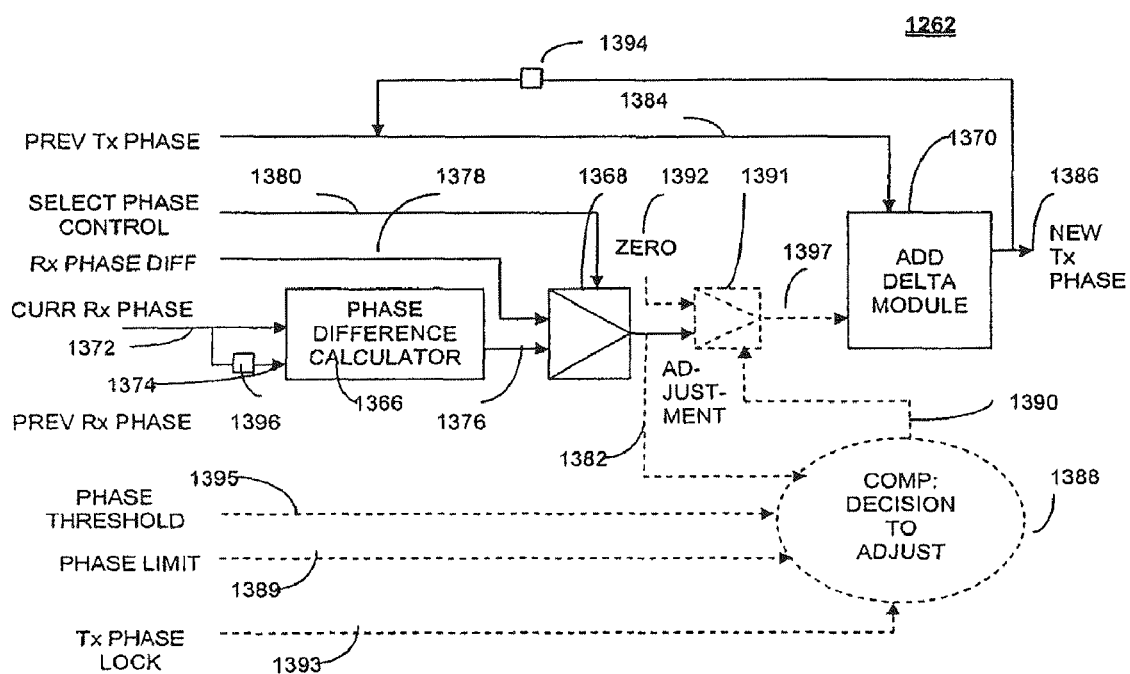
FIG. 13B illustrates another detailed view of the phase calculator depicted in FIG. 12, according to an embodiment of the present invention.

According to an embodiment of the present invention, phase calculator 1262 also optionally includes an adjust decision module 1388, as shown in FIG. 13B. In an embodiment of the present invention, adjust decision module 1388 receives a phase threshold 1395 and a phase limit signal 1389, as well as phase adjustment value 1382. Phase limit signal 1389 signifies whether the phase should be limited to a threshold or not. Adjust decision module 1388 determines whether phase adjustment value 1382 exceeds predetermined phase threshold 1395, and outputs decision signal 1390 to a zero/adjustment multiplexer 1391 accordingly, depending on phase limit signal 1389. For example, if phase limit signal 1389 signifies that the phase should be limited to a threshold, and adjust decision module 1388 determines that phase adjustment value 1382 exceeds predetermined phase threshold 1395, then decision signal 1390 signifies that no adjustment is to be made. As another example, if phase limit signal 1389 signifies that the phase should be limited to a threshold, and adjust decision module 1388 determines that phase adjustment value 1382 does not exceed predetermined phase threshold 1395, then decision signal 1390 signifies that a phase adjustment is to be made. As a third example, if phase limit signal 1389 signifies that the phase should not be limited to a threshold, then decision signal 1390 signifies that a phase adjustment is to be made, regardless of whether phase threshold 1395 is exceeded.

Zero/adjustment multiplexer 1391 receives decision signal 1390, phase adjustment value 1382, and a zero adjustment value 1392 (i.e., a value of zero). Zero/adjustment multiplexer 1391 selects zero adjustment value 1392 if decision signal 1390 signifies that a phase adjustment is not to be made. Alternatively, zero/adjustment multiplexer 1391 selects phase adjustment value 1382 if decision signal 1390 signifies that a phase adjustment is to be made. A zero/adjustment selection 1397 made by zero/adjustment multiplexer 1391 is output to add delta module 1370. If zero adjustment value 1392 is selected, add delta module 1370 adds a value of zero to the previous transmit clock signal phase 1384, resulting in a new transmit phase value 1386 equaling the previous transmit clock signal phase 1384. In effect, when this occurs, the transmit clock signal phase is not adjusted. If instead phase adjustment value 1382 is selected, add delta module 1370 adds or subtracts (depending on the specified direction) phase adjustment value 1382 to/from the previous transmit clock signal phase 1384, resulting in a new transmit phase value 1386.

According to another embodiment of the present invention, adjust decision module 1388 receives a transmit phase lock signal 1393. The adjust decision module 1388 determines whether transmit phase lock signal 1393 signifies that a transmit phase lock is set (i.e., that the phase is not to be adjusted). It may be desired for a transmit phase lock to be set if data is switched from one lane to another (e.g., when receive data is switched from one transmit lane to another transmit lane). If adjust decision module 1388 determines from transmit phase lock signal 1393 that a transmit phase lock is set, then adjust decision module 1388 outputs decision signal 1390 to zero/adjustment multiplexer 1391 signifying that no phase adjustment is to be made. Alternatively, if adjust decision module 1388 determines from transmit phase lock signal 1393 that a transmit phase lock is not set, then adjust decision module 1388 outputs decision signal 1390 to zero/adjustment multiplexer 1391 signifying that a phase adjustment is to be made (assuming there is no phase threshold limitation).

As in the previous embodiment involving a phase threshold limitation, zero/adjustment multiplexer 1391 receives decision signal 1390, phase adjustment value 1382, and a zero adjustment value 1392 (i.e., a value of zero). Zero/adjustment multiplexer 1391 selects zero adjustment value 1392 if decision signal 1390 signifies that a phase adjustment is not to be made. Alternatively, zero/adjustment multiplexer 1391 selects phase adjustment value 1382 if decision signal 1390 signifies that a phase adjustment is to be made. A zero/adjustment selection 1397 made by zero/adjustment multiplexer 1391 is output to add delta module 1370. If zero adjustment value 1392 is selected, add delta module 1370 adds a value of zero to the previous transmit clock signal phase 1384, resulting in a new transmit phase value 1386 equaling the previous transmit clock signal phase 1384. In effect, when this occurs, the transmit clock signal phase is not adjusted. If instead phase adjustment value 1382 is selected, add delta module 1370 adds or subtracts (depending on the specified direction) phase adjustment value 1382 to/from the previous transmit clock signal phase 1384, resulting in a new transmit phase value 1386.

According to an embodiment of the invention, phase calculator 1262 includes all of the components and inputs of the embodiments described above with reference to FIGS. 13A and 13B. In this embodiment, decision signal 1390 signifies to zero/adjustment multiplexer 1391 whether to select phase adjustment value 1382 or zero adjustment value 1392 (i.e., a value of zero), based on phase limit signal 1389, phase threshold 1395, and transmit phase lock signal 1393. According to this embodiment, adjust decision module 1388 manages the phase limit signal 1389, phase threshold 1395, and transmit phase lock signal 1393 by utilizing the configuration of components shown in FIG. 14.

Figure 14:
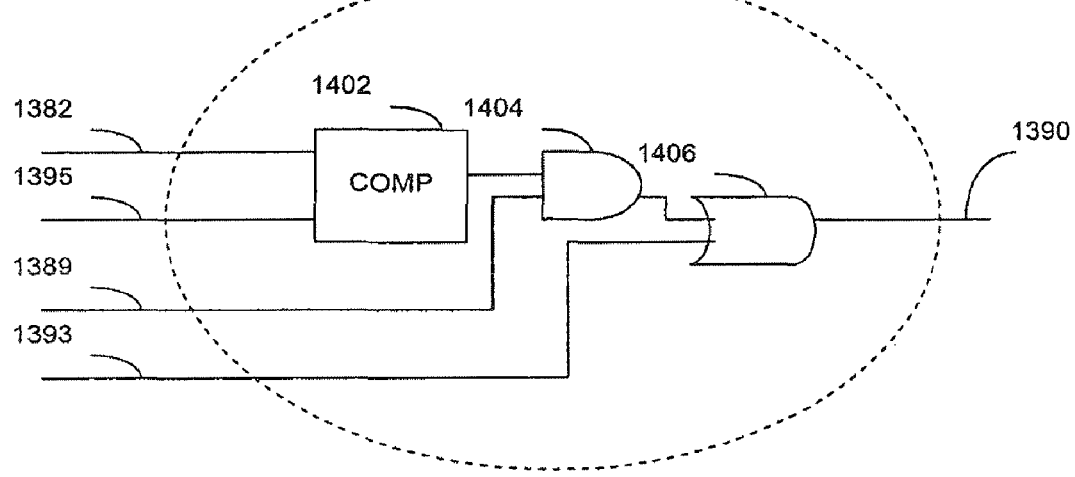
FIG. 14 illustrates a more detailed view of component 1388 of the phase calculator depicted in FIG. 13B, according to an embodiment of the present invention.

FIG. 14 depicts an expanded view of adjust decision module 1388 in which adjust decision module 1388 includes a comparator 1402, an AND gate 1404, and an OR gate 1406, configured as shown. In this embodiment, comparator 1402 compares input phase threshold 1395 with input phase adjustment value 1382 to determine whether phase adjustment value 1382 exceeds phase threshold 1395. AND gate 1404 determines whether the threshold determination made by comparator 1402 is to be used as a factor in determining phase adjustment, depending on input phase limit signal 1389. Finally, OR gate 1406 determines whether the phase is to be locked at its current state regardless of the threshold-related determinations made by comparator 1402 and gate 1404.

Figure 15:
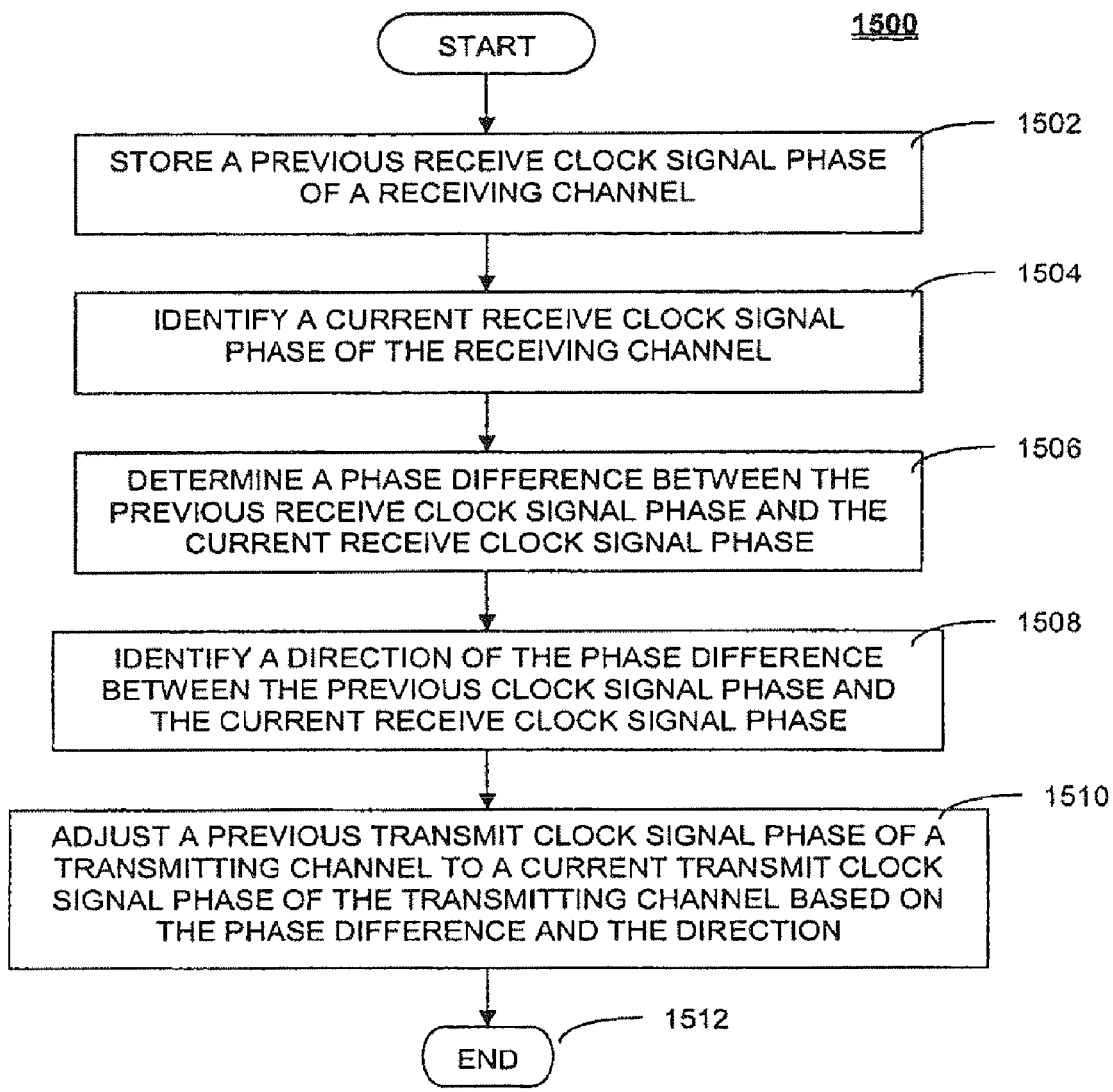
FIG. 15 depicts a flowchart of a method of synchronizing a receive clock signal phase with a transmit clock signal phase, according to an embodiment of the present invention.

A method, according to an embodiment of the present invention, of synchronizing a receive clock signal phase of a receiving channel with a transmit clock signal phase of a transmitting channel in a transceiver is described in reference to FIG. 15. Method 1400 begins at step 1502. In step 1502, a previous receive clock signal phase of a receiving channel is stored. for later comparison. In step 1504, a current receive clock signal phase of the receiving channel is identified. In step 1506, a phase difference between the previous receive clock signal phase and the current receive clock signal phase is determined. In step 1508, a direction of the phase difference between the previous clock signal phase and the current receive clock signal phase is identified. The direction may be identified as was described previously with reference to FIG. 8. In step 1510, a previous transmit clock signal phase of a transmitting channel is adjusted to a current transmit clock signal phase of the transmitting channel based on the phase difference and direction. Method 1500 then terminates. According to an embodiment of the present invention, steps 1502, 1504, 1506, and 1508 occur at the receiving channel, and step 1510 occurs at the transmitting channel. In another embodiment, step 1504 occurs at the receiving channel, and steps 1502, 1506, 1508, and 1510 occur at the transmitting channel.

Figure 16:
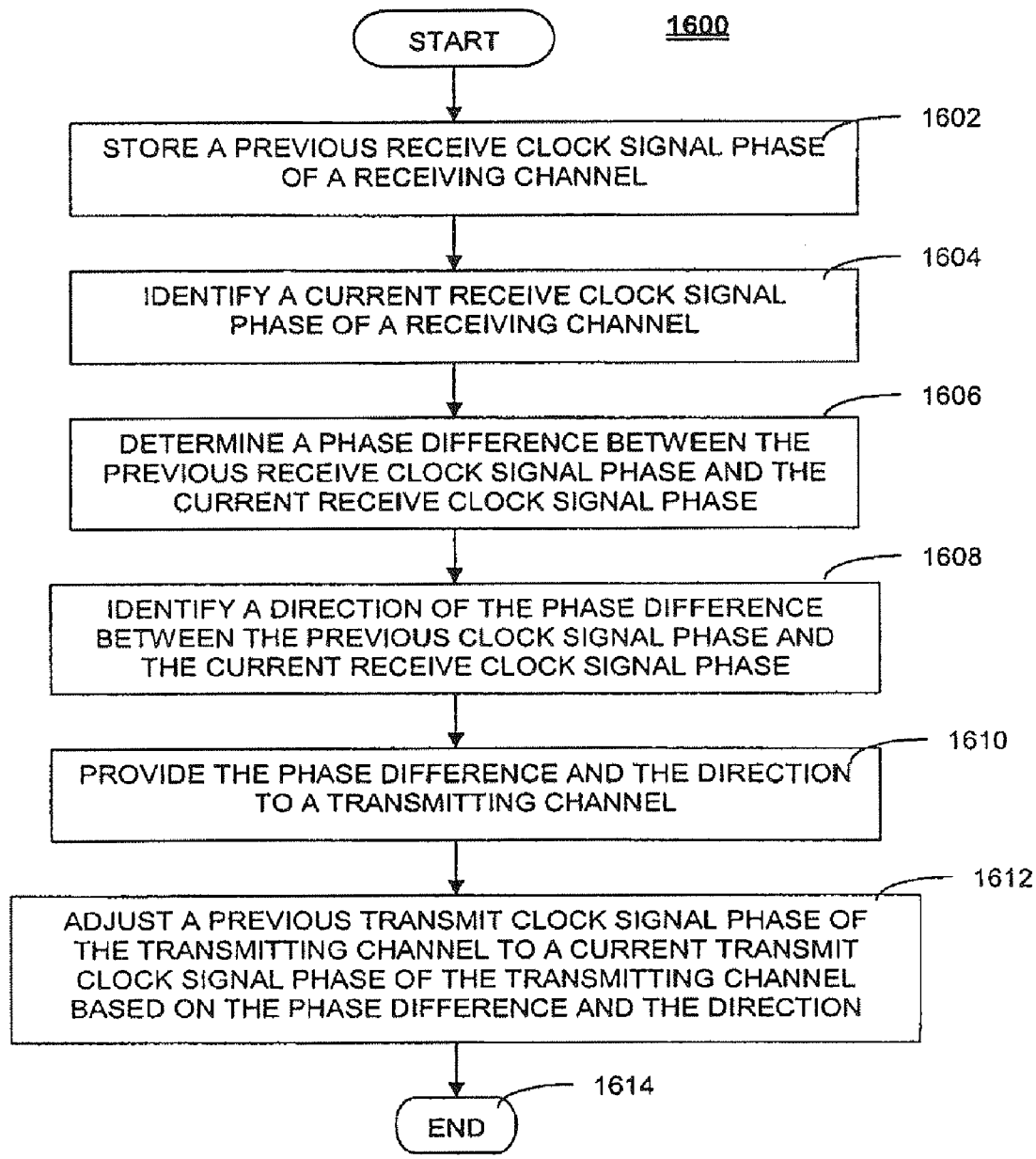
FIG. 16 depicts a flowchart of a method of synchronizing a receive clock signal phase with a transmit clock signal phase, according to another embodiment of the present invention in which a phase difference and direction is provided to a transmitter.

According to a further embodiment of the present invention, a method of synchronizing a receive clock signal phase of a receiving channel with a transmit clock signal phase of a transmitting channel in a transceiver is described in reference to FIG. 16. Method 1600 begins at step 1602. In step 1602, a previous receive clock signal phase of a receiving channel is stored. for later comparison. In step 1604, a current receive clock signal phase of the receiving channel is identified. In step 1606, a phase difference between the previous receive clock signal phase and the current receive clock signal phase is determined. In step 1608, a direction of the phase difference between the previous clock signal phase and the current receive clock signal phase is identified. The direction may be identified as was described previously with reference to FIG. 8. In step 1610, the phase difference and direction is provided to a transmitting channel. In step 1612, a previous transmit clock signal phase of a transmitting channel is adjusted to a current transmit clock signal phase of the transmitting channel based on the phase difference and direction. Method 1600 then terminates at 1614. In this embodiment, steps 1602, 1604, 1606, 1608, and 1610 occur at the receiving channel, and step 1612 occurs at the transmitting channel.

Figure 17:
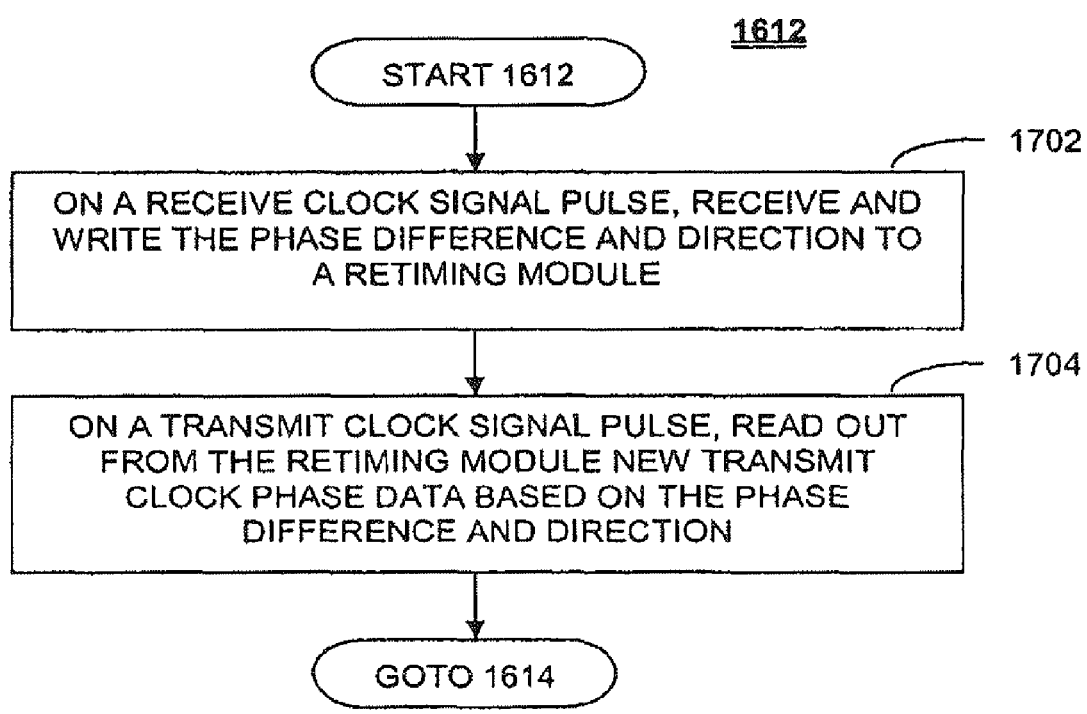
FIG. 17 depicts a flowchart of the adjusting step of FIG. 16, according to an embodiment of the present invention.

Step 1612 of method 1600 is further described in FIG. 17, according to an embodiment of the present invention. Step 1612 begins with step 1702. In step 1702, on a receive clock signal pulse, the phase difference and direction are received and written to a retiming module. In step 1704, on a transmit clock signal pulse, new transmit clock phase data is read out from the retiming module based on the phase difference and direction. Step 1612 then continues at step 1614, where the method terminates.

Figure 18:
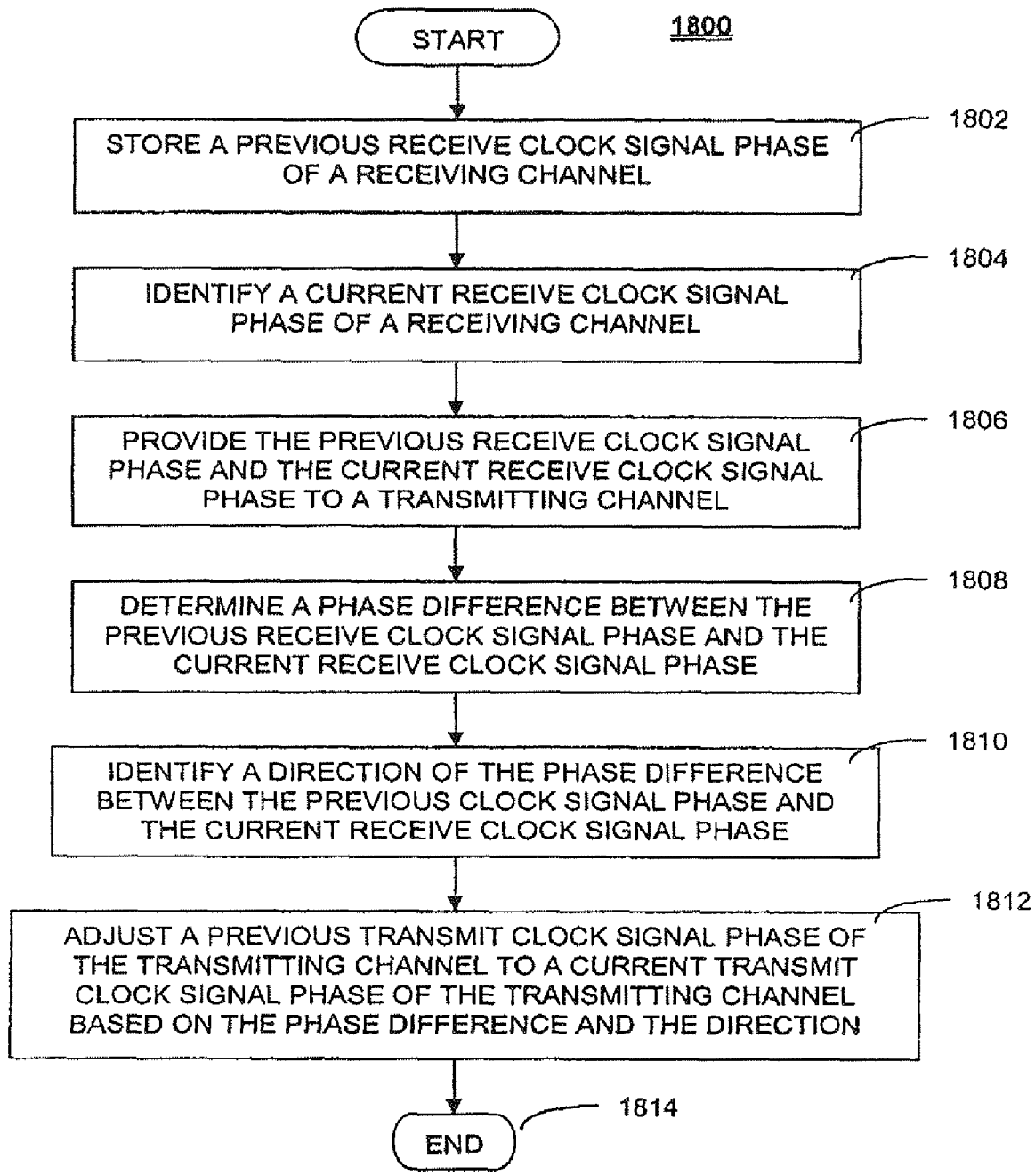
FIG. 18 depicts a flowchart of a method of synchronizing a receive clock signal phase with a transmit clock signal phase, according to a further embodiment of the present invention in which a previous receive clock signal phase and a current receive clock signal phase is provided to a transmitter.

According to yet another embodiment of the present invention, a method of synchronizing a receive clock signal phase of a receiving channel with a transmit clock signal phase of a transmitting channel in a transceiver is described in reference to FIG. 18. Method 1800 begins at step 1802. In step 1802, a previous receive clock signal phase of a receiving channel is stored. for later comparison. In step 1804, a current receive clock signal phase of the receiving channel is identified. In step 1806, the previous receive clock signal phase and the current receive clock signal phase is provided to a transmitting channel. In step 1808, a phase difference between the previous receive clock signal phase and the current receive clock signal phase is determined. In step 1810, a direction of the phase difference between the previous clock signal phase and the current receive clock signal phase is identified. The direction may be identified as was described previously with reference to FIG. 8. In step 1812, a previous transmit clock signal phase of the transmitting channel is adjusted to a current transmit clock signal phase of the transmitting channel based on the phase difference and direction. Method 1800 then terminates at 1814. In this embodiment, steps 1804 and 1806 occur at the receiving channel, and steps 1802, 1808, 1810, and 1812 occur at the transmitting channel.

Figure 19:
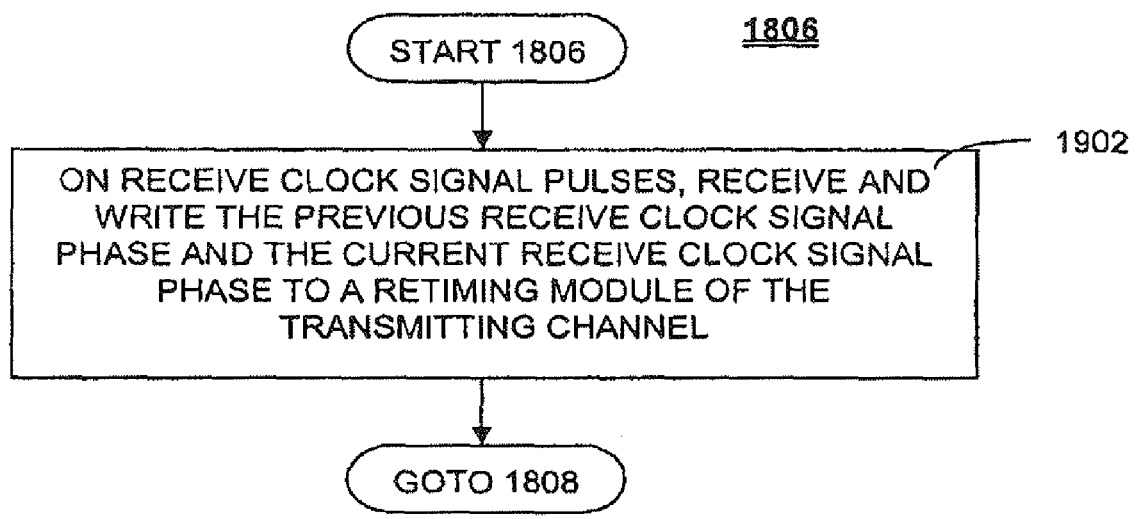
FIG. 19 depicts a flowchart of the providing step of FIG. 18, according to an embodiment of the present invention.

Step 1806 of method 1800 is further described in FIG. 19, according to an embodiment of the present invention. Step 1806 begins with step 1902. In step 1902, on receive clock signal pulses, the previous receive clock signal phase and the current receive clock signal phase are received and written to a retiming module of the transmitting channel. Step 1806 then continues at step 1808.

Figure 20:
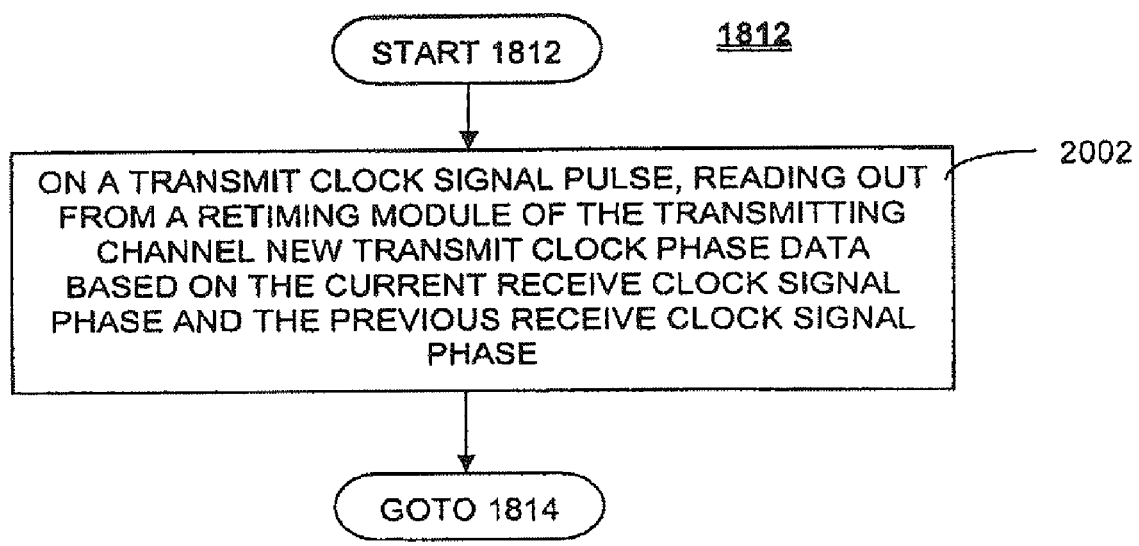
FIG. 20 depicts a flowchart of the adjusting step of FIG. 18, according to an embodiment of the present invention.

According to an embodiment of the present invention, step 1812 of method 1800 is further described in FIG. 20. Step 1812 begins with step 2002. In step 2002, on a transmit clock signal pulse, new transmit clock phase data, based on the current receive clock signal phase and the previous receive clock signal phase, is read out from a retiming module of the transmitting channel. Step 1812 then continues at step 1814, where the method terminates.

Figure 21:
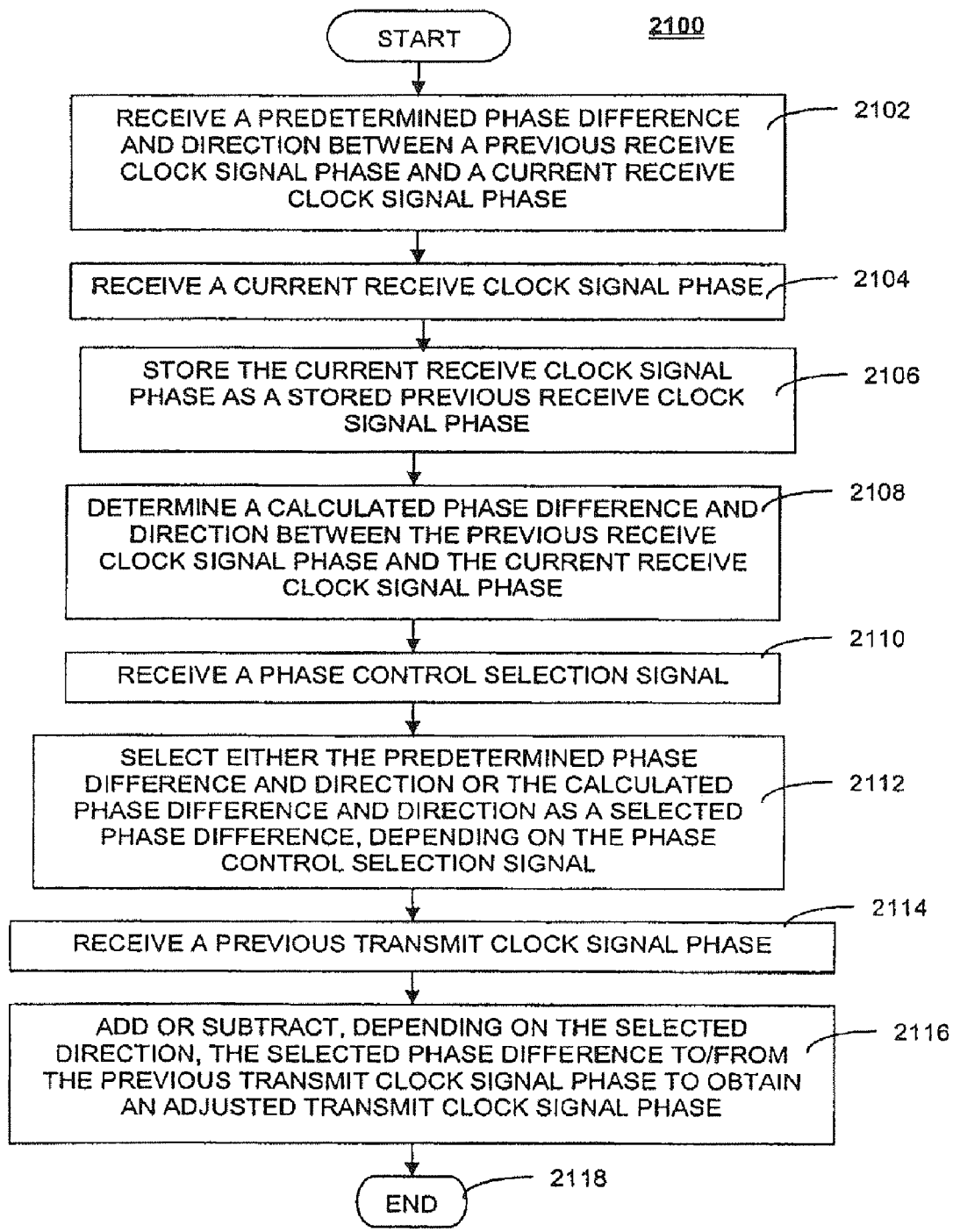
FIG. 21 depicts a flowchart of a method of phase-locking a transmit clock signal phase with a receive clock signal phase, according to an embodiment of the present invention.

A method, according to an embodiment of the present invention, of phase-locking a transmit clock signal phase with a receive clock signal phase, is described in reference to FIG. 21. Method 2100 begins at step 2102. In step 2102, a predetermined phase difference and direction between a previous receive clock signal phase and a current receive clock signal phase is received. In step 2104, a current receive clock signal phase is received. In step 2106, the current receive clock signal phase is stored as a stored previous receive clock signal phase. In step 2108, a calculated phase difference and direction between the previous receive clock signal phase and the current receive clock signal phase is determined. In step 2110, a phase control selection signal is received. In step 2112, either the predetermined phase difference and direction or the calculated phase difference and direction is selected as the selected phase difference (and direction) to be used, depending on the phase control selection signal. In step 2114, a previous transmit clock signal phase is received. In step 2116, the selected phase difference is added or subtracted (depending on the specified selected direction) to the previous transmit clock signal phase to obtain an adjusted transmit clock signal phase. Method 2100 terminates at step 2118.

Figure 22A:
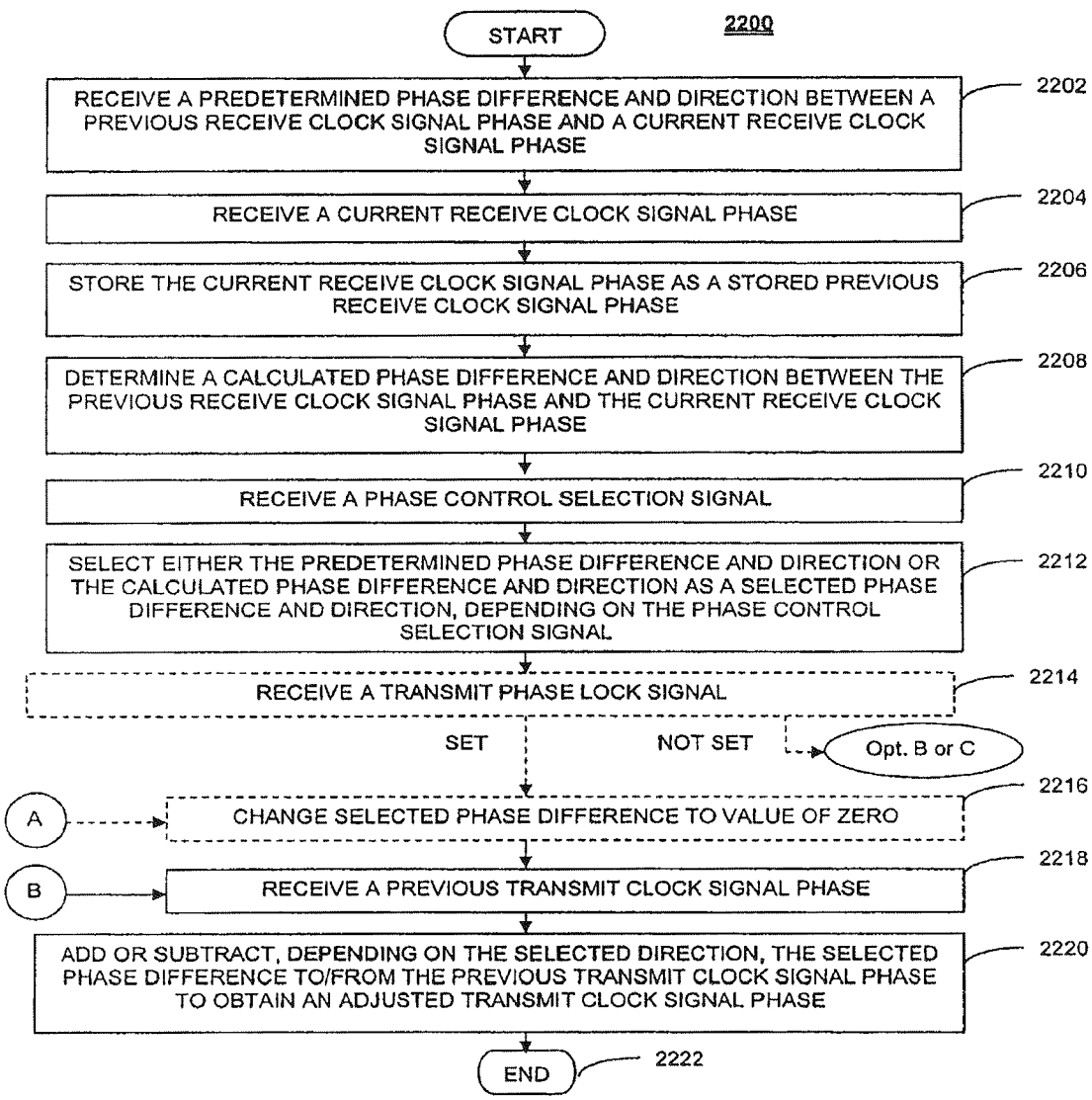
FIGS. 22A and 22B depict a flowchart of a method of phase-locking a transmit clock signal phase with a receive clock signal phase, according to another embodiment of the present invention in which control signals are used to limit phase adjustment.
Figure 22B:
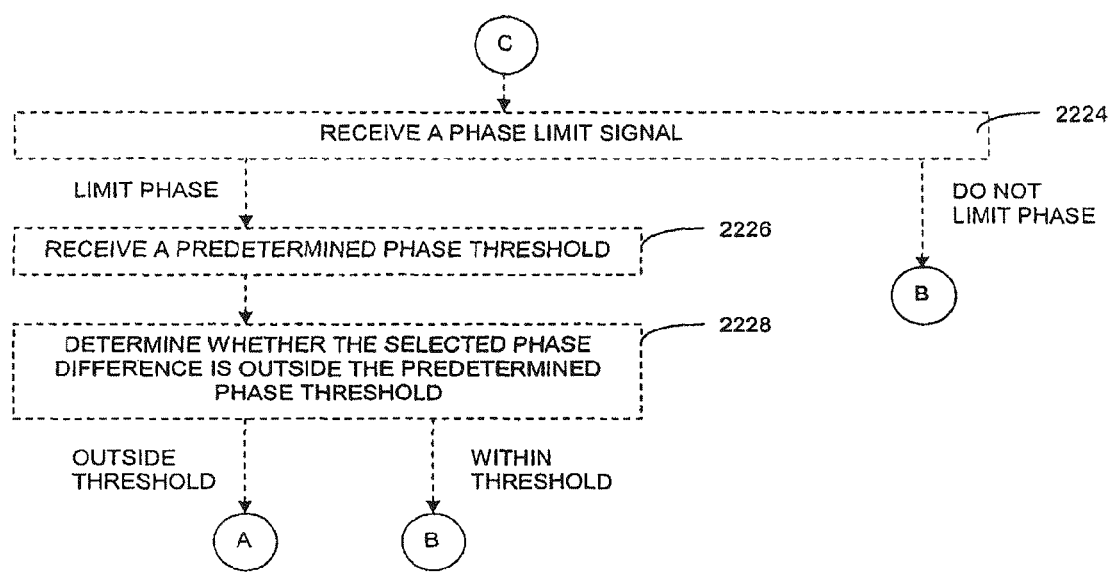

A method, according to another embodiment of the present invention, of phase-locking a transmit clock signal phase with a receive clock signal phase, is described in reference to FIGS. 22A and 22B. Method 2200 begins at step 2202. In step 2202, a predetermined phase difference and direction between a previous receive clock signal phase and a current receive clock signal phase is received. In step 2204, a current receive clock signal phase is received. In step 2206, the current receive clock signal phase is stored as a stored previous receive clock signal phase. In step 2208, a calculated phase difference and direction between the previous receive clock signal phase and the current receive clock signal phase is determined. In step 2210, a phase control selection signal is received. In step 2212, either the predetermined phase difference and direction or the calculated phase difference and direction is selected as the selected phase difference and direction to be used, depending on the phase control selection signal. In step 2214, a transmit phase lock signal is received. If the transmit phase lock signal is set, signifying that no adjustment is to be made, then the method continues at step 2216. In step 2216, the selected phase difference is changed to a value of zero. In step 2218, a previous transmit clock signal phase is received. In step 2220, the selected phase difference is added to or subtracted from (depending on the specified direction) the previous transmit clock signal phase to obtain an adjusted transmit clock signal phase. In this scenario, the transmit clock signal phase remains unchanged (i.e., no phase adjustment). Method 2200 terminates at step 2222.

If, instead, the transmit phase lock signal is not set in step 2214, signifying that an adjustment may be made, the method continues at step 2218 in one embodiment, or alternatively at step 2224 (FIG. 22B) in another embodiment, if the phase adjustment is optionally to be limited to a phase threshold. In the embodiment with no phase threshold option, step 2214 proceeds to step 2218. In step 2218, a previous transmit clock signal phase is received. In step 2220, the selected phase difference is added to or subtracted from (depending on the specified direction) the previous transmit clock signal phase to obtain an adjusted transmit clock signal phase. Method 2200 terminates at step 2222.

In the embodiment involving the phase threshold option, if the transmit phase lock signal is not set in step 2214, the method continues at step 2224. In step 2224, a phase limit signal is received. The phase limit signal signifies whether to limit phase adjustment of the previous transmit clock signal phase regardless of whether the selected phase difference is outside a predetermined phase threshold. If the phase limit signal signifies that phase adjustment is not to be limited, the method proceeds to step 2218. If the phase limit signal signifies that phase adjustment is to be limited, the method proceeds to step 2226. In step 2226, a predetermined phase threshold is received. In step 2228, it is determined whether the selected phase difference is outside the predetermined phase threshold. If the selected phase difference is outside the predetermined phase threshold, then the method continues at step 2216 in which the selected phase difference is changed to a value of zero (i.e., no phase adjustment is to be made). If the selected phase difference is within the predetermined phase threshold, then the method continues at step 2218. In step 2218, a previous transmit clock signal phase is received. In step 2220, the selected phase difference is added to or subtracted from (depending on the specified direction) the previous transmit clock signal phase to obtain an adjusted transmit clock signal phase. Method 2200 terminates at step 2222.

Figure 23:
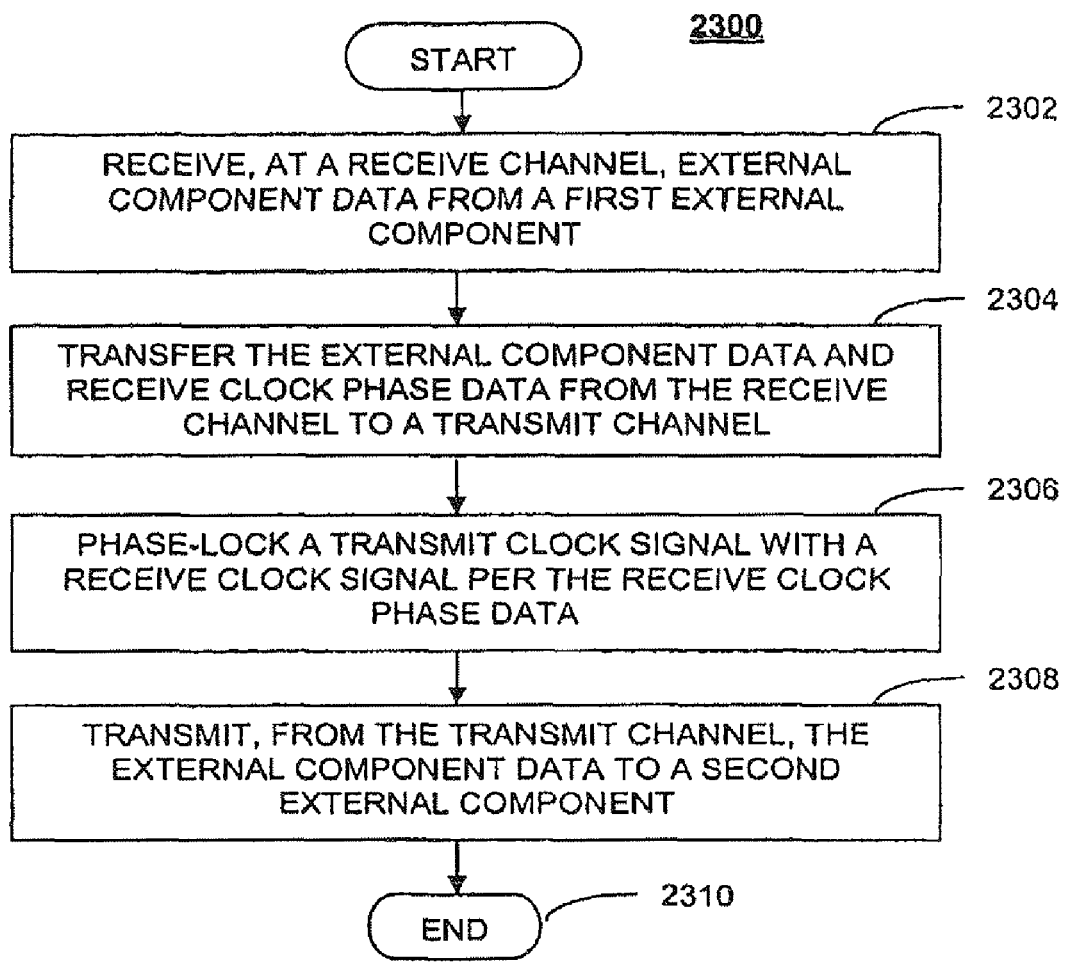
FIG. 23 depicts a flowchart of a method of transferring data from a first external component to a second external component using a transceiver system such as disclosed herein, according to an embodiment of the present invention.

A method of transferring data from a first external component coupled to a receive channel of a transceiver system to a second external component coupled to a transmit channel of the transceiver system, according to another embodiment of the present invention, is described in reference to FIG. 23. The external components include, but are not limited to, disk drives. Method 2300 begins at step 2302. In step 2302, external component data from a first external component is received at a receive channel. In step 2304, the external component data and receive clock phase data is transferred from the receive channel to a transmit channel. In step 2306, a transmit clock signal is phase-locked with a receive clock signal per the receive clock phase data. In step 2308, the external component data is transmitted from the transmit channel to a second external component. Method 2300 then terminates.

The systems and methods described above include essentially two phase difference calculation options. In the first option, a phase difference and direction are calculated at a receive channel and transferred to a transmit channel for the adjustment of the transmit clock phase. In the second option, the calculation of the phase difference and direction is made at the transmit channel. Both options are preferably programmed in the system so that either can be selected. One advantage of using the first option is that fewer bits are transferred. One advantage of using the second option is that if the receive channel and transmit channel are located far away from each other, it is safer to do the calculation locally at the transmit channel. If the first option is used in this situation, the phase difference may have changed again by the time it reaches the transmit channel, placing data integrity at risk.

CONCLUSION

This disclosure presents a transceiver system with a transmit clock signal phase phase-locked with a receive clock signal phase. This disclosure also presents a method of transferring data from a first external component to a second external component using a transceiver system such as disclosed herein. By slaving the phases through an appropriate mechanism such as the present invention, a robust design results in which a transmit frequency of the device can track a receive frequency with no loss of data/information. While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A transceiver comprising:
   a plurality of serializer/deserializer (SERDES) cores, each SERDES core having one or more SERDES lanes, each SERDES lane having a receive channel and a transmit channel,
   wherein a transmit clock signal of an active transmit channel is configured to be phase-locked with a receive clock signal of a corresponding active receive channel based on receive clock information that is generated from the active receive channel.

2. The transceiver of claim 1, wherein the active receive channel being of a different SERDES lane than that of the active transmit channel.

3. The transceiver of claim 1, wherein one or more of the SERDES cores receives and transmits data to and from external components.

4. The transceiver of claim 3, wherein the external components include disk drives.

5. The transceiver of claim 3, wherein the external components include databases.

6. The transceiver of claim 1, wherein the active transmit channel is part of a first SERDES lane of a common SERDES core, and the corresponding active receive channel is part of a second SERDES lane of the common SERDES core.

7. The transceiver of claim 1, wherein the active transmit channel is part of a first SERDES lane of a first SERDES core, and the corresponding active receive channel is part of a second SERDES lane of a second SERDES core.

8. The transceiver of claim 1, wherein the transceiver is one of a plurality of transceiver chips.

9. The transceiver of claim 8, wherein the plurality of transceiver chips are disposed on a common board.

10. The transceiver of claim 8, wherein a first transceiver chip of the plurality of transceiver chips is disposed on a first board, and a second transceiver chip of the plurality of transceiver chips is disposed on a second board.

11. The transceiver of claim 1, wherein the receive clock information is provided through a parallel connection from the active receive channel to the active transmit channel.

12. A transceiver comprising:
a plurality of serializer/deserializer (SERDES) cores, each SERDES core having one or more SERDES lanes, each SERDES lane having a receive channel and a transmit channel,
wherein a transmit clock signal of an active transmit channel is phase-locked with a receive clock signal of a corresponding active receive channel based on received clock information, wherein the receive clock information includes a phase difference between a current receive clock signal phase and a previous receive clock signal phase.

13. The transceiver of claim 12, wherein a transmit clock phase of the transmit clock signal is determined based on the received clock information.

14. The transceiver of claim 13, wherein digital data from the active receive channel is converted to an analog format to generate serial output data, and the serial output data is transmitted according to the transmit clock having the transmit clock phase determined based on the received clock information.

15. The transceiver of claim 12, wherein the active transmit channel further comprises a phase calculator configured to determine a transmit clock phase of the transmit clock signal based on the received clock information.

16. The transceiver of claim 12, wherein the received clock information further includes a direction associated with the phase difference between the current receive clock signal phase and the previous receive clock signal phase.

17. The transceiver of claim 16, wherein the active transmit channel further comprises a phase calculator configured to determine a transmit clock phase based on the phase difference and the direction.

18. The transceiver of claim 12, wherein the active transmit channel further comprises an analog transmit serializer configured to convert digital data from the active receive channel to an analog format to generate serial output data, and transmit the serial output data according to the transmit clock signal having the phase determined based on said received clock information.

19. The transceiver of claim 12, wherein the phase difference of the received clock information is one of a plurality of phase differences, and the transmit clock signal is phase locked to the receive clock signal based on the selection of one of the plurality of phase differences.

20. The transceiver of claim 12, wherein one of the plurality of phase differences is a calculated phase difference and another of the plurality of phase differences phase differences is a predetermined phase difference.

* * * * *

UNITED STATES PATENT AND TRADEMARK OFFICE
CERTIFICATE OF CORRECTION

PATENT NO. : 8,111,738 B2
APPLICATION NO. : 12/881108
DATED : February 7, 2012
INVENTOR(S) : Amirichimeh et al.

It is certified that error appears in the above-identified patent and that said Letters Patent is hereby corrected as shown below:

Column 16, line 36, please replace "phase differences phase differences" with --phase differences--.

Signed and Sealed this
Twenty-fourth Day of April, 2012

David J. Kappos
*Director of the United States Patent and Trademark Office*